United States Patent
Hwang

(10) Patent No.: US 11,372,806 B2
(45) Date of Patent: Jun. 28, 2022

(54) STORAGE DEVICE AND SERVER INCLUDING THE STORAGE DEVICE

(71) Applicant: SAMSUNG ELECTRONICS CO., LTD., Suwon-si (KR)

(72) Inventor: Joo-Young Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 288 days.

(21) Appl. No.: 16/249,271

(22) Filed: Jan. 16, 2019

(65) Prior Publication Data

US 2019/0332573 A1    Oct. 31, 2019

(30) Foreign Application Priority Data

Apr. 30, 2018 (KR) .......................... 10-2018-0050133

(51) Int. Cl.
| | | |
|---|---|---|
| G06F 16/00 | (2019.01) | |
| G06F 16/11 | (2019.01) | |
| G06F 16/182 | (2019.01) | |
| G06F 16/41 | (2019.01) | |
| G06F 16/13 | (2019.01) | |

(52) U.S. Cl.
CPC ............ G06F 16/116 (2019.01); G06F 16/13 (2019.01); G06F 16/183 (2019.01); G06F 16/41 (2019.01)

(58) Field of Classification Search
None
See application file for complete search history.

(56) References Cited

U.S. PATENT DOCUMENTS

| | | | |
|---|---|---|---|
| 6,738,844 B2 | 5/2004 | Kanai | |
| 7,133,925 B2* | 11/2006 | Mukherjee | H04L 65/607 375/E7.013 |
| 7,380,160 B2 | 5/2008 | Jung | |
| 8,265,140 B2* | 9/2012 | Mehrotra | H04N 19/164 375/240.22 |
| 8,395,991 B2 | 3/2013 | Sachdeva et al. | |
| 8,881,856 B2 | 3/2014 | Bae | |
| 8,692,883 B2 | 4/2014 | Jang | |
| 8,719,888 B1 | 5/2014 | Xu et al. | |
| 9,282,337 B2* | 3/2016 | Dong | H04N 21/6587 |

(Continued)

FOREIGN PATENT DOCUMENTS

| | | |
|---|---|---|
| GB | 2552879 | 2/2018 |
| KR | 10-2012-0012089 | 2/2012 |

(Continued)

OTHER PUBLICATIONS

US 9,632,925 B2, 04/2017, Duran (withdrawn)

(Continued)

*Primary Examiner* — Jean M Corrielus
(74) *Attorney, Agent, or Firm* — F. Chau & Associates, LLC

(57) ABSTRACT

A storage device includes: a non-volatile memory including a first memory area and a second memory area, and a memory controller configured to receive a request from a first client device to upload a first multimedia file, generate a second multimedia file including a base layer and at least one enhancement layer by transcoding the first multimedia file from an original format to a scalable format, and control the non-volatile memory to store the second multimedia file in the non-volatile memory.

13 Claims, 30 Drawing Sheets

(56) References Cited

U.S. PATENT DOCUMENTS

| | | | |
|---|---|---|---|
| 9,319,717 B2* | 4/2016 | Hannuksela | H04N 21/24 |
| 9,780,910 B2 | 10/2017 | Wadsworth et al. | |
| 9,817,591 B2 | 11/2017 | Hwang | |
| 9,824,006 B2 | 11/2017 | Duran | |
| 2004/0179606 A1* | 9/2004 | Zhou | H04N 19/40 |
| | | | 375/E7.184 |
| 2005/0254575 A1* | 11/2005 | Hannuksela | H04N 19/70 |
| | | | 375/240.1 |
| 2007/0016594 A1* | 1/2007 | Visharam | H04N 19/30 |
| 2010/0111165 A1 | 5/2010 | Kim et al. | |
| 2010/0198887 A1* | 8/2010 | Visharam | H04N 21/25808 |
| | | | 707/825 |
| 2010/0223407 A1* | 9/2010 | Dong | H04N 21/2402 |
| | | | 710/70 |
| 2010/0260254 A1 | 10/2010 | Kimmich et al. | |
| 2011/0099418 A1 | 4/2011 | Chen | |
| 2011/0216821 A1 | 9/2011 | Kim et al. | |
| 2012/0016917 A1* | 1/2012 | Priddle | H04N 21/433 |
| | | | 707/827 |
| 2012/0047535 A1 | 2/2012 | Bennett et al. | |
| 2012/0075436 A1 | 3/2012 | Chen et al. | |
| 2012/0207454 A1 | 8/2012 | Kim | |
| 2012/0294352 A1* | 11/2012 | Koum | H04N 21/41407 |
| | | | 375/E7.198 |
| 2013/0176784 A1 | 7/2013 | Cometti et al. | |
| 2013/0195184 A1 | 8/2013 | Nam | |
| 2013/0311745 A1 | 11/2013 | Harris et al. | |
| 2013/0346456 A1* | 12/2013 | Sparenberg | G06F 16/13 |
| | | | 707/825 |
| 2014/0040530 A1 | 2/2014 | Chen et al. | |
| 2014/0267714 A1 | 9/2014 | Mistry et al. | |
| 2014/0314393 A1 | 10/2014 | Berger et al. | |
| 2015/0131972 A1* | 5/2015 | Reisman | G06F 3/16 |
| | | | 386/285 |
| 2015/0156281 A1* | 6/2015 | Krieger | H04N 19/40 |
| | | | 709/203 |
| 2015/0213044 A1* | 7/2015 | Sparenberg | G06F 16/14 |
| | | | 707/823 |
| 2015/0222938 A1* | 8/2015 | Hasek | H04L 67/2842 |
| | | | 725/92 |
| 2016/0219344 A1* | 7/2016 | Dong | H04N 19/40 |
| 2016/0255355 A1* | 9/2016 | Andersson | H04N 19/157 |
| | | | 375/240.02 |
| 2017/0006253 A1* | 1/2017 | Martin | G11B 27/28 |
| 2017/0222987 A1* | 8/2017 | Krieger | H04L 67/42 |
| 2017/0244988 A1* | 8/2017 | Hasek | H04L 67/2823 |
| 2018/0095665 A1 | 4/2018 | Xu et al. | |

FOREIGN PATENT DOCUMENTS

| | | |
|---|---|---|
| KR | 10-1386864 | 4/2014 |
| KR | 10-2018-0074327 | 6/2016 |

OTHER PUBLICATIONS

Containerized media cloud for video transcoding service, IEEE, Dong et al., (Year: 2018).*

A Reliability Enhancement Design under the Flash Translation Layer for MLC-Based Flash-Memory Storage Systems, ACM (Year: 2013).*

Search Report and Written Opinion dated Sep. 12, 2019 in corresponding Patent Application No. 10201901275P (Intellectual Property Office of Singapore).

Charles Cassidy, "SLC vs MCL: Which works best for high-reliability applications?" Telecommunication Systems, Jul. 16, 2012 (https://www.eetimes.com/document.asp?doc_ids=1279762#.

Extended European Search Report dated Mar. 14, 2019 in corresponding European Patent Appln. No. 19152622.7-1208.

1st Office Action dated Mar. 11, 2021 in corresponding EP Patent Application No. 19152622.7.

* cited by examiner

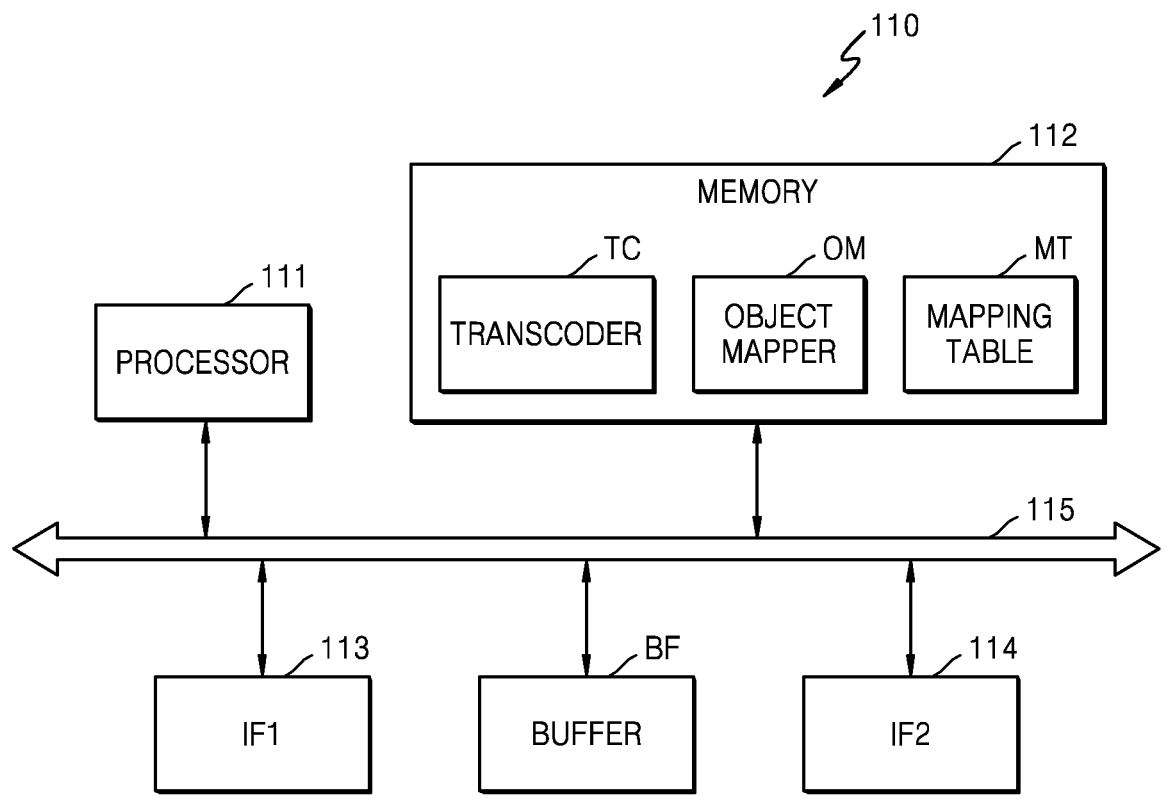

| OBJECT ID | LAYER | PPN |
|---|---|---|
| OID1 | BL | PPN11 (MA1) |
| | EL1 | PPN12 (MA2) |
| | EL2 | PPN13 (MA2) |
| OID2 | BL | PPN21 (MA1) |
| | EL1 | PPN22 (MA2) |
| | EL2 | PPN23 (MA2) |
| ... | ... | ... |

| OBJECT ID | BR | PPN |
|---|---|---|
| OID1 | BR1 | PPN11' (MA1) |
| | BR2 | PPN12' (MA2) |
| | BR3 | PPN13' (MA2) |
| OID2 | BR1 | PPN21' (MA1) |
| | BR2 | PPN22' (MA2) |
| | BR3 | PPN23' (MA2) |
| ... | ... | ... |

STORAGE DEVICE AND SERVER INCLUDING THE STORAGE DEVICE

CROSS-REFERENCE TO RELATED APPLICATION

This U.S. non-provisional patent application claims the benefit of and priority under 35 U.S.C. 119 to Korean Patent Application No. 10-2018-0050133, filed on Apr. 30, 2018, in the Korean Intellectual Property Office, the disclosure of which is incorporated by reference in its entirety herein.

BACKGROUND

1. Technical Field

The inventive concept relates to a storage device, and more particularly, to a storage device capable of providing a multimedia file at a plurality of resolutions and a server including the storage device.

2. Discussion of Related Art

As mobile devices become widespread, the number of users using social network services is increasing. A user may upload a multimedia file, such as a photograph or a video, to a virtual space on a social network service by using a mobile device. The user may access the virtual space on the social network service by using other devices to reproduce the multimedia file and may share the multimedia file with other users connected to the virtual space on the social network service. Accordingly, a server providing a social network service requires a storage device having a very large storage capacity.

Screen sizes of various devices for reproducing multimedia files may be different from each other, and the resolutions of multimedia files that may be reproduced in various devices may also be different from each other. Accordingly, since a server needs to generate a plurality of files corresponding to different resolutions, it takes a lot of resources and time to generate these files.

SUMMARY

At least one embodiment of the inventive concept provides a storage device capable of providing a multimedia file at a plurality of resolutions while reducing the storage space of the multimedia file, and a server including the storage device.

According to an exemplary embodiment of the inventive concept, there is provided a storage device including: a non-volatile memory including a first memory area and a second memory area; and a memory controller configured to receive a request from a first client device to upload a first multimedia file, generate a second multimedia file including a base layer and at least one enhancement layer by transcoding the first multimedia file from an original format to a scalable format, and control the non-volatile memory to store the second multimedia file in the non-volatile memory.

According to an exemplary embodiment of the inventive concept, there is provided a server capable of communicating with a client device, the server including: a first storage device including a transcoder configured to transcode a multimedia file received from the client device from an original format to a scalable format; a second storage device storing a non-scalable format file of a non-scalable format; and a processor configured to control communication between the first storage device and the second storage device. The transcoder is further configured to receive the non-scalable format file from the second storage device and transcode the received non-scalable format file into a scalable format file of the scalable format.

According to an exemplary embodiment of the inventive concept, there is provided a server capable of communicating with a client device, the server including: a transcoding module configured to transcode a multimedia file received from the client device from an original format to a scalable format; a storage device storing a non-scalable format file of a non-scalable format; and a processor configured to control communication between the transcoding module and the storage device. The transcoding module is further configured to receive the non-scalable format file from the storage device and transcode the received non-scalable format file into a scalable format file of the scalable format.

According to an exemplary embodiment of the inventive concept, there is provided a memory controller including: a transcoder configured to receive a upload request for a first multimedia object, and generate a second multimedia object including a base layer and at least one enhancement layer by transcoding the first multimedia object from an original format to a scalable format, in response to the upload request; and an object mapper configured to determine a physical address for storing the second multimedia object associated with one of a plurality of object identifiers IDs stored in a mapping table.

BRIEF DESCRIPTION OF THE DRAWINGS

Embodiments of the inventive concept will be more clearly understood from the following detailed description taken in conjunction with the accompanying drawings in which:

FIG. 14 is a block diagram of a memory controller of FIG. 12, according to an exemplary embodiment of the inventive concept;

FIGS. 15A to 15C illustrate mapping tables, respectively, according to some embodiments of the inventive concept;

DETAILED DESCRIPTION OF THE EMBODIMENTS

Figure 1:
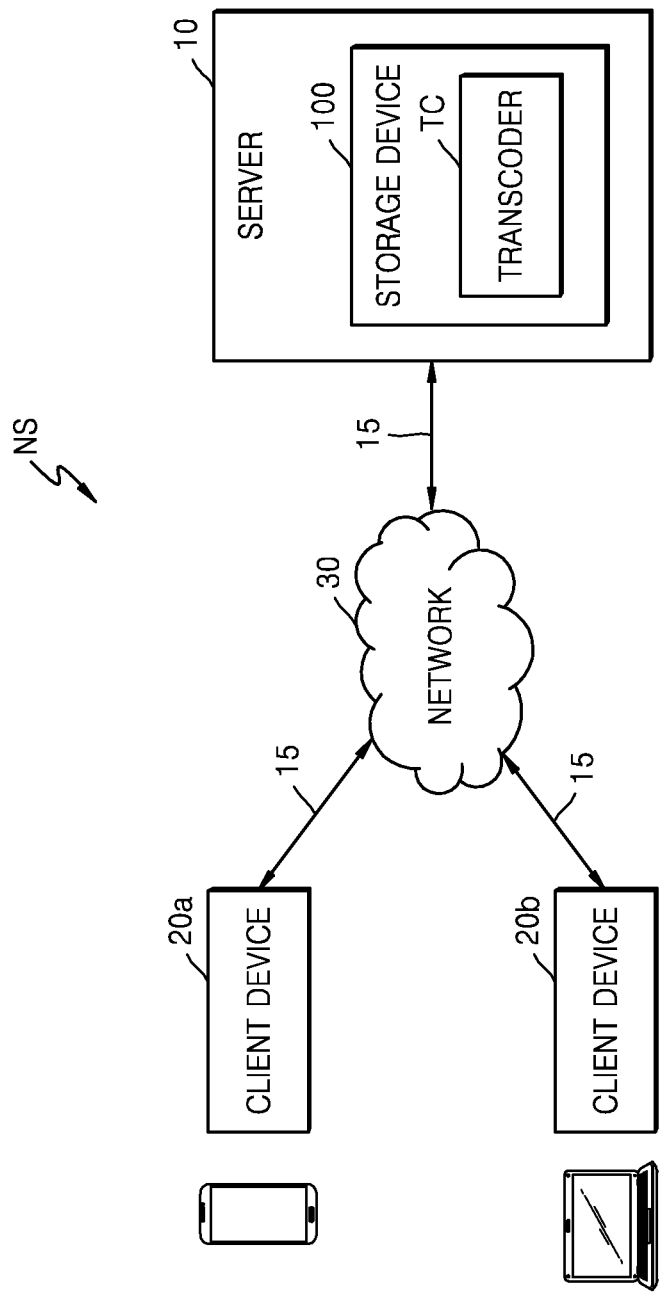
FIG. 1 illustrates a network system according to an exemplary embodiment of the inventive concept.

FIG. 1 illustrates a network system NS according to an exemplary embodiment of the inventive concept.

Referring to FIG. 1, the network system NS includes a server 10 and first and second client devices 20a and 20b. The first and second client devices 20a and 20b may communicate with the server 10 via a network 30. The first and second client devices 20a and 20b may be a fixed terminal or a mobile terminal, and implemented as a computer device. For example, the first and second client devices 20a and 20b may be a smart phone, a mobile phone, a navigation device, a computer, a notebook, a digital broadcast terminal, a personal digital assistant (PDA), a portable multimedia player (PMP), or a tablet personal computer (PC).

The server 10 may be implemented as a computer device or a plurality of computer devices that communicate with the first and second client devices 20a and 20b through the network 30 to provide commands, codes, files, content, and services. The server 10 includes a storage device 100, and accordingly, the server 10 may be referred to as a storage server. In an embodiment, the server 10 includes a platform providing a multimedia streaming service and serves as a streaming server for real-time transcoding. Transcoding may refer to converting one form of coded representation to another. In an embodiment, the multimedia streaming service is a service which transmits a moving image file (e.g., a video) or an image source (e.g., an image) stored in the server 10 to the first and second client devices 20a and 20b. In an embodiment, data reception and reproduction are simultaneously performed in the first and second client devices 20a and 20b using the multimedia streaming service. The importance of this type of service has become widely recognized in accordance with the proliferation of mobile and cloud environments in recent years.

The server 10 includes the storage device 100 having a transcoder TC. For example, the transcoder TC may be implemented by a device that converts a first file in a first coded representation to a second file in a second other coded representation. The storage device 100 may also be referred to as local storage. In an embodiment, the server 10 receives a request from the first client device 20a to upload a multimedia file. In an embodiment, after the first client device 20a has finished uploading the multimedia file having an original format to the storage device 100, the transcoder TC transcodes the multimedia file from the original format to a scalable format, and stores the transcoded file in the scalable format in the storage device 100. The transcoding may change a file format, a resolution, and/or an image quality of the multimedia file. For example, the transcoding could change a multimedia image file in a bitmap (BMP) format to a joint photographic experts group format (JPEG) format, the transcoding could change a high resolution JPEG file to a low resolution JPEG file, etc. However, the inventive concept is not limited to any particular image file format.

In an embodiment, the server 10 provides a file that enables installation of an application to the first client device 20a via the network 30. The first client device 20a may install the application by using the file provided from the server 10. For example, the first client device 20a may install the application by executing the file. The first client device 20a may access the server 10 under the control of an operating system or at least one program (e.g., a browser or an application) to receive a service or content provided by the server 10. The operation of the second client device 20b is similar to that of the first client device 20a, and thus will not be described.

In an embodiment, the server 10 is a network storage such as a network attached storage (NAS). For example, the first and second client devices 20a and 20b may be various electronic devices such as televisions, computers, and smart phones in a home. The resolution of a file reproducible on the television may be different from the resolution of a file reproducible on the smart phone. The server 10 can operate with a reduced storage capacity by storing a scalable format file without storing a plurality of files corresponding to different resolutions. For example, instead of storing the multimedia file statically in low, medium, and high resolution formats, the server can store a single scalable format file that represents the multimedia file, and files of various resolutions can be derived from the single file as needed.

In an embodiment, a communication method between the server 10 and the first and second client devices 20a and 20b includes not only a communication method using a mobile communication network, a wired Internet, a wireless Internet, and a broadcasting network, but also a near field wireless communication method between devices. For example, the network 30 may include one or more of networks such as an ad hoc network, an intranet, an extranet, a personal area network (PAN), a local area network (LAN), a wireless LAN, a campus area network (CAN), a metropolitan area network (MAN), a wide area network (WAN), a broadband network (BBN), a public switched telephone network (PSTN), and the Internet.

Links 15 connect the first and second client devices 20a and 20b and the server 10 to the network 30 or connect them to each other. For example, the links 15 may include one or more wired lines (e.g., a digital subscriber line (DSL) or a data over cable service interface specification (DOCSIS)), a wireless link (e.g., Wi-Fi or worldwide interoperability for microwave access (WiMAX)), and/or an optical link (e.g., synchronous optical network (SONET) or synchronous digital hierarchy (SDH). The links 15 need not necessarily be the same in the network system NS.

Figure 2:
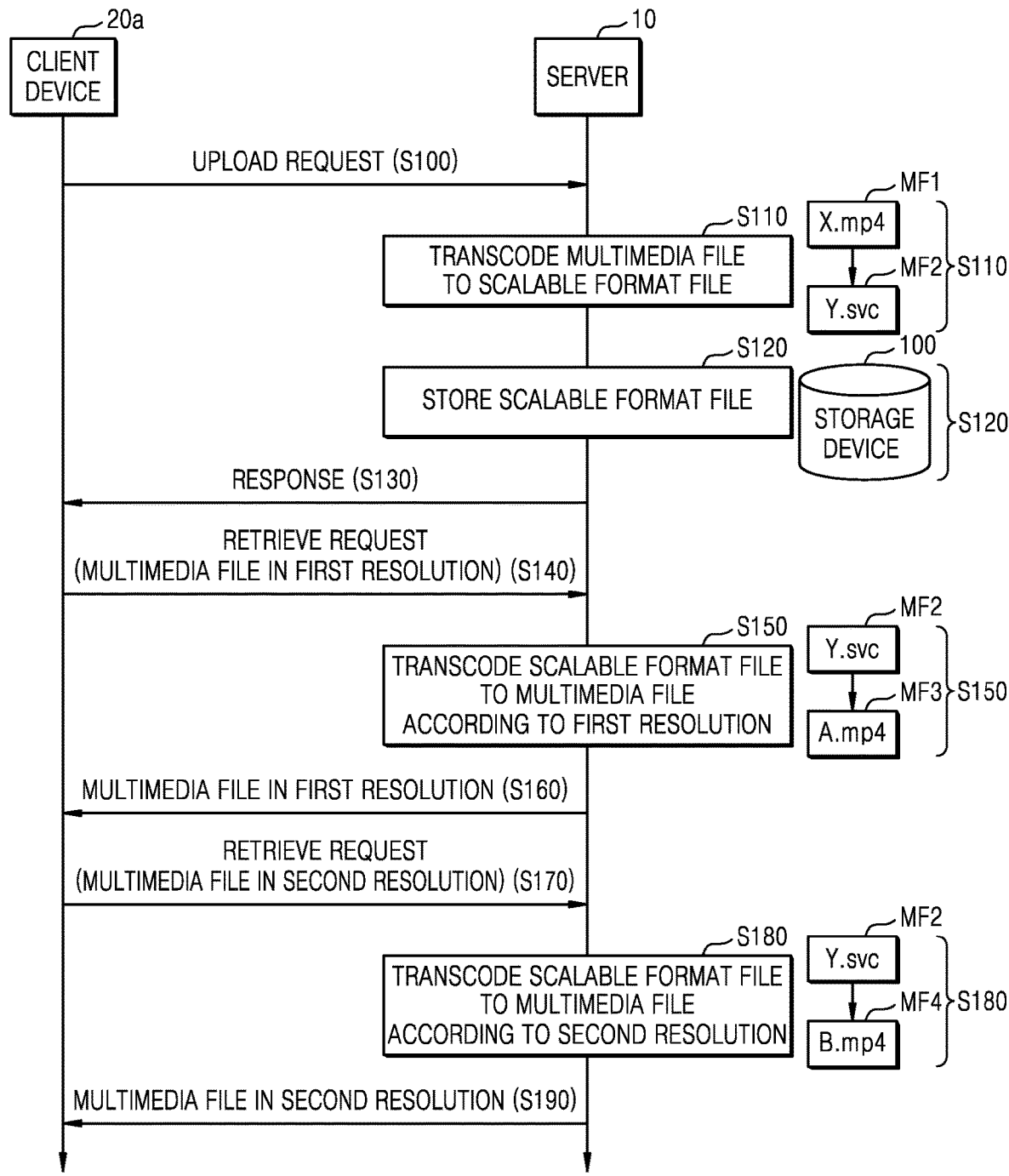
FIG. 2 is a flowchart illustrating an operation between a first client device and a server of FIG. 1, according to an exemplary embodiment of the inventive concept.

FIG. 2 is a flowchart illustrating an operation between the first client device 20a and the server 10 of FIG. 1, according to an exemplary embodiment of the inventive concept.

Referring to FIG. 2, in operation S100, the first client device 20a transmits a request to upload a multimedia file or a multimedia object to the server 10. For example, the multimedia file may be a picture file (e.g., an image), a moving picture file (e.g., a video), an audio file, or a three-dimensional model file. In an embodiment, the first client device 20a transmits a request to the server 10 to generate an additional object, in addition to the upload request. For example, the first client device 20a may transmit to the server 10 a request to generate a plurality of multimedia objects respectively corresponding to different formats or resolutions, based on the multimedia object.

In an embodiment, the first client device 20a indicates, in attribute information of a multimedia object, whether the loss of the multimedia object is allowed, and the first client device 20a transmits to the server 10 information indicating whether the loss of the multimedia object is allowed, in addition to the upload request. For example, when the loss of the multimedia object is allowed, the server 10 continues a streaming service even if some data of the multimedia object is lost. For example, when the loss of the multimedia object is not allowed, the server 10 may transmit an error message to a client device, which desires to read the multimedia object, when some data of the multimedia object is lost. In an embodiment, the request to upload the multimedia file/object includes the multimedia file/object. In another embodiment, the server 10 sends a message to the client device 20a in response to the upload request indicating the client device 20a has permission to upload the multimedia file/object to the server 10, and the client device 20a sends the multimedia file/object to the server 10 in response to receipt of the message.

In operation S110, the server 10 transcodes a received multimedia file into a scalable format file. In an embodiment, the scalable format file is a file including a base layer and at least one enhancement layer. For example, the scalable format file may be a file according to scalable video coding (SVC) or progressive JPEG format. In operation S120, the server 10 stores the scalable format file in the storage device 100. In an embodiment, prior to the transcoding, the server 10 stores the received multimedia file temporarily in an internal buffer, and after the transcoding, the contents of the internal buffer can be overwritten with any newly received data or discarded. Details of operations S110 and S120 will be described below with reference to FIG. 3.

In operation S130, the server 10 transmits a response message, which indicates that an upload operation has completed, to the first client device 20a. For example, the server 10 may send the response message after generation or storage of the scalable format file has completed. In an embodiment, the server 10 further transmits a response message, which indicates that the generation of a plurality of multimedia objects respectively corresponding to different formats or resolutions has completed, to the first client device 20a. Accordingly, a user of the first client device 20a may recognize that the server 10 stores a plurality of multimedia objects respectively corresponding to different formats or resolutions. Details of operation S130 will be described below with reference to FIG. 4.

Figure 3:
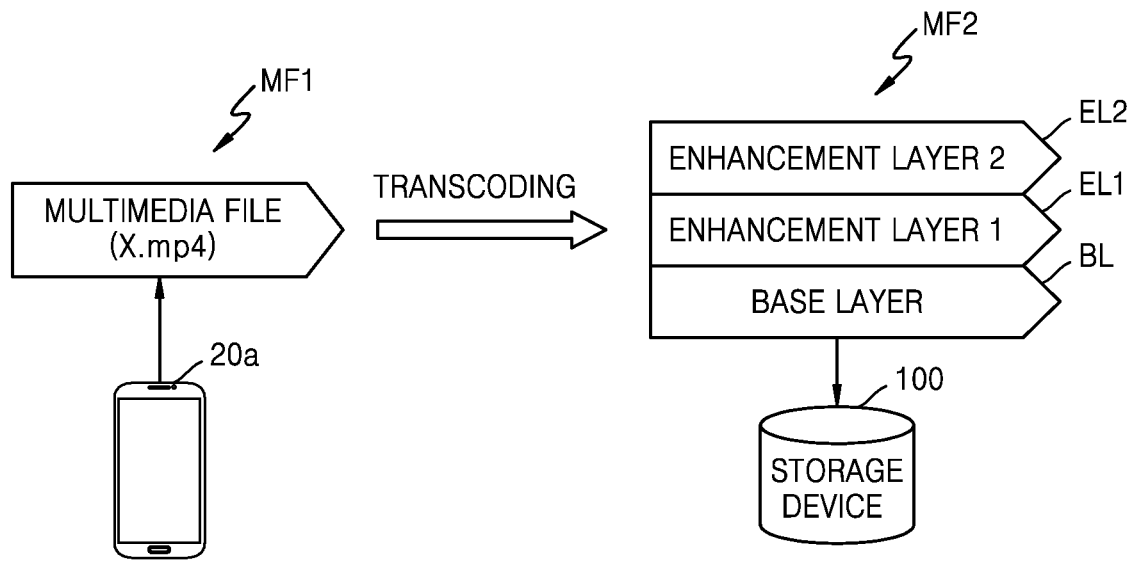
FIG. 3 illustrates a transcoding operation performed in a server of FIG. 2, according to an exemplary embodiment of the inventive concept.

FIG. 3 illustrates a transcoding operation performed in the server 10 of FIG. 2, according to an exemplary embodiment of the inventive concept.

Referring to FIGS. 2 and 3, the first client device 20a transmits a first multimedia file MF1, for example, X.mp4 (e.g., mpeg layer-4 audio), to the server 10. In an embodiment, the server 10 generate a second multimedia file MF2 (e.g., Y.svc) by transcoding the first multimedia file MF1 from an original format to a scalable format, and stores the second multimedia file MF2 in the storage device 100. In this case, the second multimedia file MF2 may include a base layer BL and at least one enhancement layer, for example, a first enhancement layer EL1 and a second enhancement layer EL2. However, the second multimedia file MF2 is not limited thereto, and the number of enhancement layers may be variously changed according to embodiments.

In an embodiment, the server 10 only performs a transcoding operation to the scalable format and does not perform a transcoding operation to another format, even if the server 10 receives from the first client device 20a a request to generate an additional object. Accordingly, resources and time required for a transcoding operation in the server 10 may be reduced. In an embodiment, the server 10 stores only the second multimedia file MF2 with the scalable format and does not store multimedia files with other formats, even if the server 10 receives from the first client device 20a a request to generate an additional object. Accordingly, the storage device 100 may greatly reduce a storage space of contents corresponding to the first multimedia file MF1.

Figure 4:
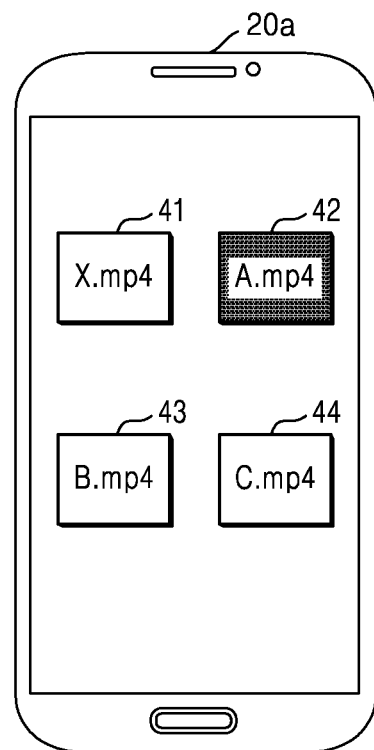
FIG. 4 illustrates a screen displayed on a client device of FIG. 1, according to an exemplary embodiment of the inventive concept.

FIG. 4 illustrates a screen displayed on the first client device 20a of FIG. 1, according to an exemplary embodiment of the inventive concept. Referring to FIGS. 2 and 4, although the server 10 stores only the second multimedia file MF2, the server 10 may transmit a response message, which indicates that the generation and storage of a plurality of multimedia files corresponding to the first multimedia file MF1 have completed, to the first client device 20a. Accordingly, first to fourth thumbnails 41 to 44 respectively corresponding to the plurality of multimedia files may be displayed on the first client device 20a. Thus, a user of the first client device 20a would conclude the server 10 is storing the uploaded multimedia file as several files of various resolutions or formats, even though the server 10 is only storing a single scalable file.

Referring back to FIG. 2, in operation S140, the first client device 20*a* transmits a retrieve request to the server 10 to request the provision of a multimedia file with a first resolution. For example, a user of the first client device 20*a* may send a retrieve request to the server 10 by selecting the second thumbnail 42 illustrated in FIG. 4. In an embodiment, the retrieve request includes the label on the selected thumbnail (e.g., "A.mp4" or "A"). In operation S150, the server 10 transcodes a scalable format file into a multimedia file with the first resolution. For example, the server 10 may generate a third multimedia file MF3, for example, A.mp4, by transcoding the second multimedia file MF2 from a scalable format to a format according to the first resolution. Details of operation S150 will be described below with reference to FIG. 5. In operation S160, the server 10 provides a transcoded multimedia file in the first resolution to the first client device 20*a*.

Figure 5:
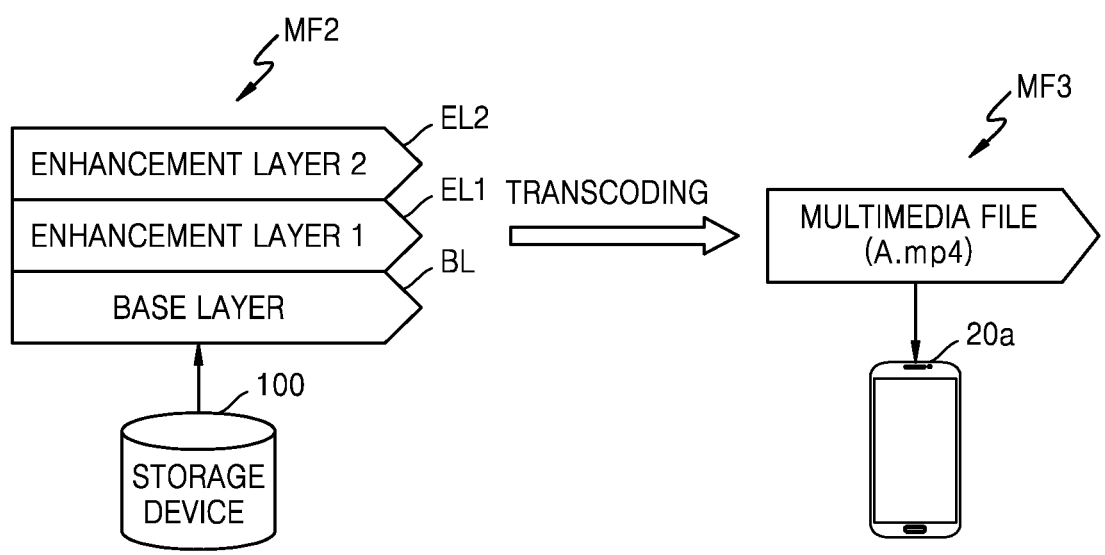
FIG. 5 illustrates a transcoding operation performed in the server of FIG. 1, according to an exemplary embodiment of the inventive concept.

FIG. 5 illustrates a transcoding operation performed in the server 10 of FIG. 1, according to an exemplary embodiment of the inventive concept. Referring to FIGS. 2 and 5, the server 10 generates a third multimedia file MF3, for example, A.mp4, by transcoding a second multimedia file MF2 stored in the storage device 100 from a scalable format to a format with the first resolution, and stores the third multimedia file MF3 in the first client device 20*a*. In an embodiment, the server 10 generates a third multimedia file MF3 based on a base layer BL. In an embodiment, the server 10 generates a third multimedia file MF3 based on a base layer BL and at least one of first and second enhancement layers EL1 and EL2. In an embodiment, the server 10 stores the third multimedia file MF3 temporarily in an internal buffer that can be overwritten with other data after storage of the third multimedia file MF3 on the first client device 20*a* has completed.

Referring back to FIG. 2, in operation S170, the first client device 20*a* transmits a retrieve request to the server 10 to request the provision of a multimedia file with a second resolution. For example, a user of the first client device 20*a* may send a retrieve request to the server 10 by selecting the third thumbnail 43 illustrated in FIG. 4. In operation S180, the server 10 transcodes a scalable format file into a multimedia file with the second resolution. For example, the server 10 may generate a fourth multimedia file MF4, for example, B.mp4, by transcoding the second multimedia file MF2 from a scalable format to a format according to the second resolution. In operation S190, the server 10 provides a transcoded multimedia file in the second resolution to the first client device 20*a*.

Figure 6:
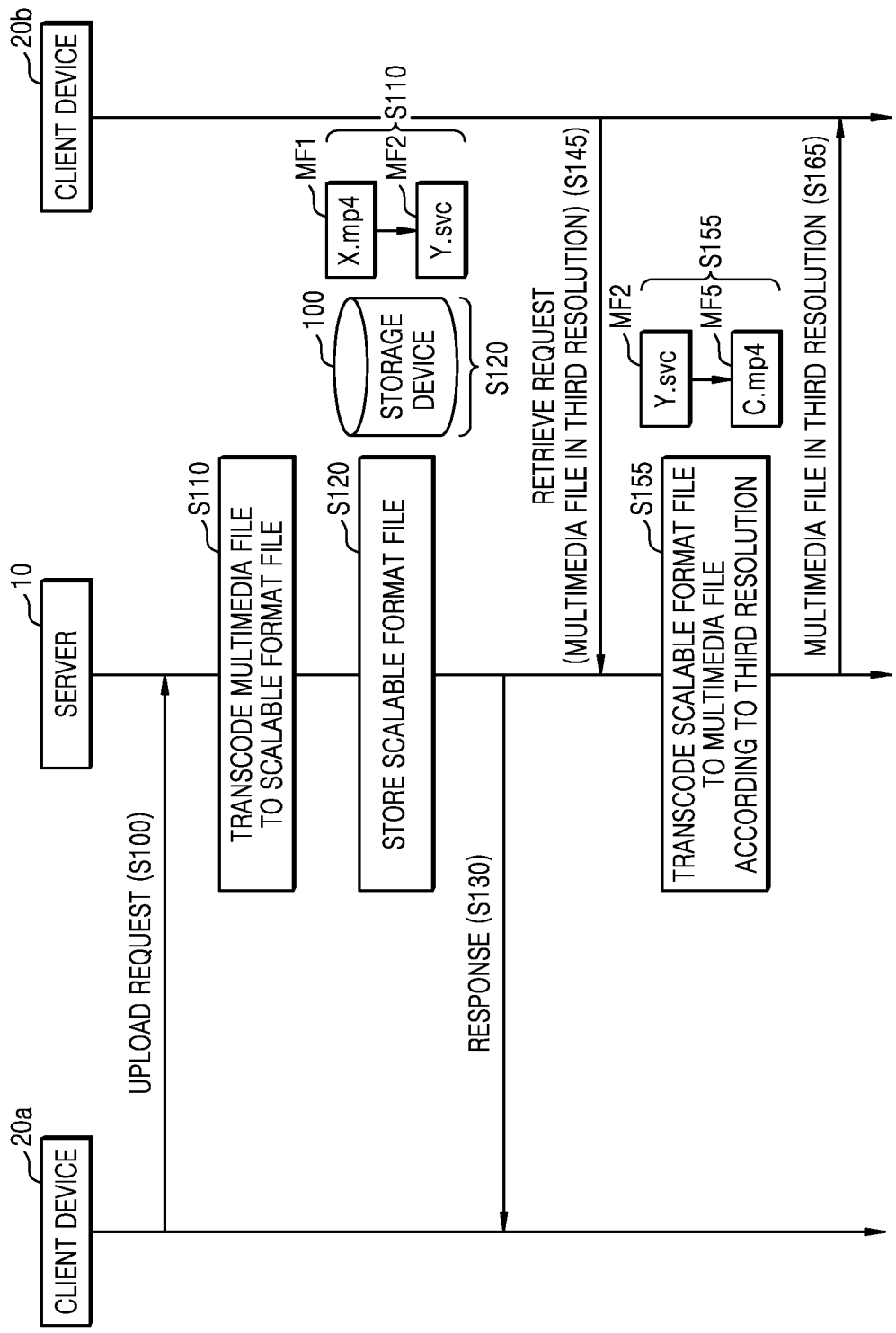
FIG. 6 is a flowchart illustrating an operation between the server and first and second client devices of FIG. 1, according to an exemplary embodiment of the inventive concept.

FIG. 6 is a flowchart illustrating an operation between the server 10 and the first and second client devices 20*a* and 20*b* of FIG. 1, according to an exemplary embodiment of the inventive concept. Referring to FIG. 6, the present embodiment corresponds to a modification of the embodiment illustrated in FIG. 2. The first client device 20*a* uploads a multimedia file to the server 10 and the second client device 20*b* receives a multimedia file from the server 10 and reproduces the received multimedia file.

In operation S145, the second client device 20*b* transmits a retrieve request to the server 10 to request the provision of a multimedia file with a third resolution. For example, a user of the second client device 20*b* may send a retrieve request to the server 10 by selecting the fourth thumbnail 44 illustrated in FIG. 4. In operation S155, the server 10 transcodes a scalable format file into a multimedia file with the third resolution. For example, the server 10 may generate a fifth multimedia file MF5, for example, C.mp4, by transcoding the second multimedia file MF2 from a scalable format to a format according to the third resolution. In operation S165, the server 10 provides a transcoded multimedia file with the third resolution to the second client device 20*b*.

Figure 7:
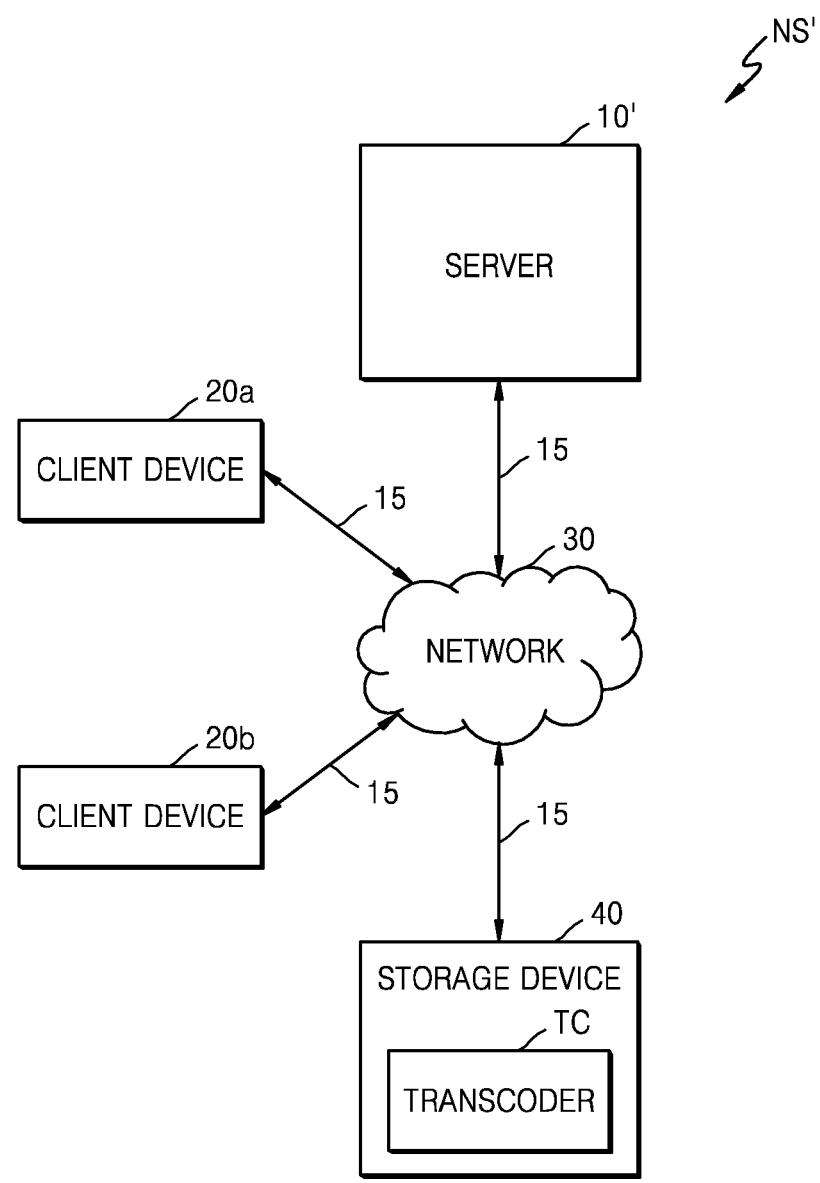
FIG. 7 illustrates a network system according to an exemplary embodiment of the inventive concept.

FIG. 7 illustrates a network system NS' according to an exemplary embodiment of the inventive concept.

Referring to FIG. 7, the network system NS' includes a server 10', first and second client devices 20*a* and 20*b*, and a storage device 40. The network system NS' according to the present embodiment corresponds to a modification of the network system NS according to the embodiment of FIG. 1. The network system NS' differs from the network system NS shown in FIG. 1 in that the network system NS' includes the storage device 40 positioned outside the server 10'. The description given above with reference to FIGS. 1 to 6 may be applied to the present embodiment.

The storage device 40 communicates with the server 10' via a network 30 and thus may be referred to as a remote storage device, a remote storage server, or a network storage device. The storage device 40 includes a transcoder TC. The transcoder TC transcodes a multimedia file from an original format to a scalable format to generate a transcoded file, and the storage device 100 stores the transcoded file with the scalable format.

Figure 8:
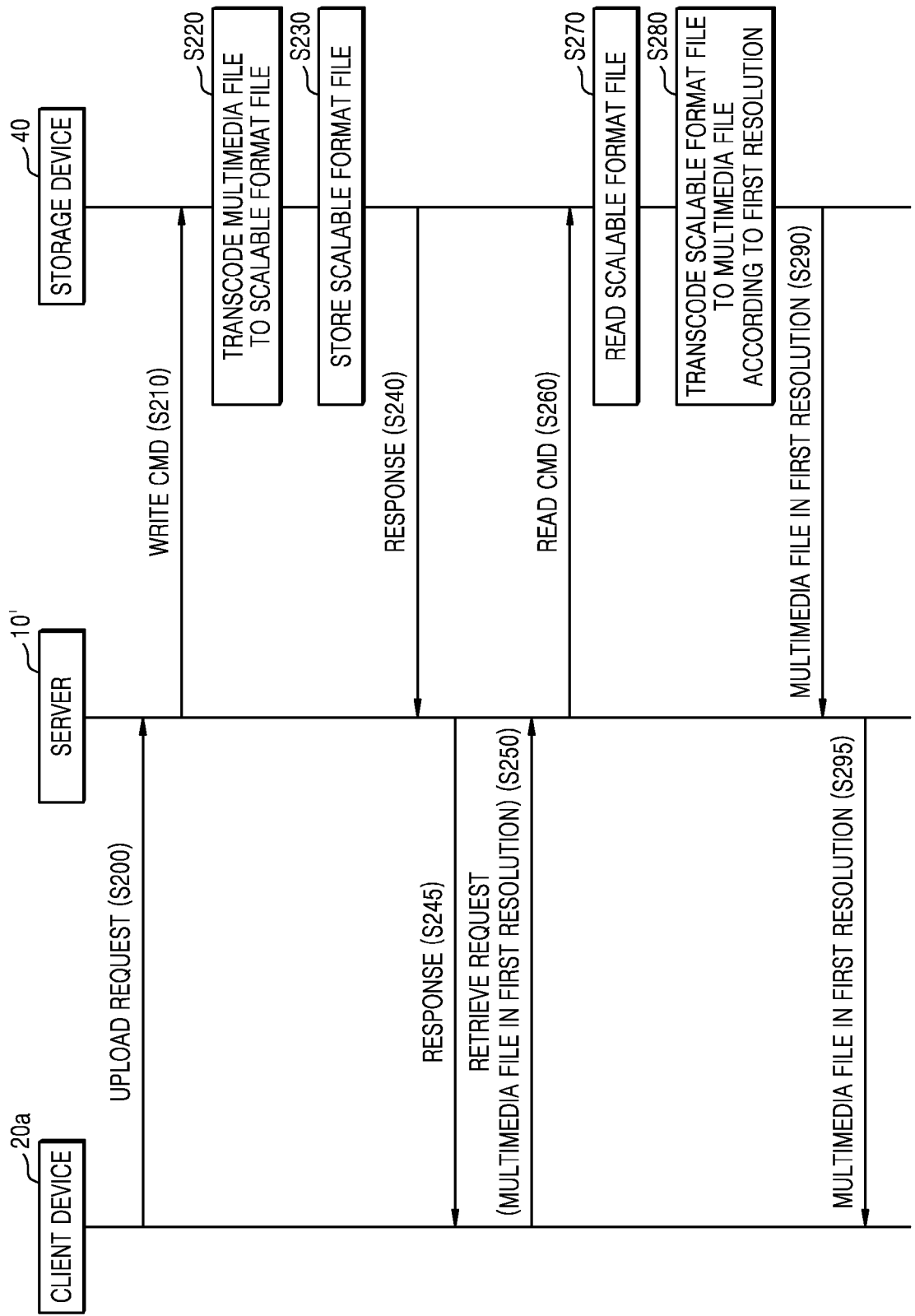
FIG. 8 is a flowchart illustrating an operation between a first client device, a server, and a storage device of FIG. 7, according to an exemplary embodiment of the inventive concept.

FIG. 8 is a flowchart illustrating an operation between the first client device 20*a*, the server 10', and the storage device 40 of FIG. 7, according to an exemplary embodiment of the inventive concept.

Referring to FIG. 8, the operation according to the present embodiment corresponds to a modification of the embodiment illustrated in FIG. 2, and the description given above with reference to FIGS. 2 to 6 may also be applied to the present embodiment. In operation S200, the first client device 20*a* transmits a request to the server 10' to upload a multimedia file or a multimedia object. In an embodiment, the first client device 20*a* transmits to the server 10' a request to generate an additional object, in addition to the upload request. In an embodiment, the server 10' sends a message to the first client device 20*a* in response to the upload request. For example, the message could indicate that the first client device 20*a* has permission to upload the multimedia file. In an embodiment, the first client device 20 transmits the multimedia file to the server 10' in response to receiving the message, and the server 10' stores the multimedia file in a temporary buffer of the storage device 40.

In operation S210, the server 10' transmits a write command for a received multimedia file or multimedia object to the storage device 40. For example, the server 10' may transmit the write command to the storage device 40 after storage of the multimedia file in the temporary buffer has completed. In operation S220, the storage device 40 transcodes a received multimedia file into a scalable format file. In an embodiment, the storage device 40 transcodes the received multimedia file in response to receipt of the write command. In an embodiment, the write command indicates the format of the scalable format file. In operation S230, the storage device 40 stores the scalable format file. In an embodiment, the storing of the scalable format file includes overwriting a location of the storage device 40 storing an original format of the multimedia file with the scalable format file. In operation S240, the storage device 40 transmits a response message to the server 10', which indicates that a write operation has completed. For example, the response message may indicate that the scalable format file has been stored. In operation S245, the server 10' transmits a response message to the first client device 20a, which indicates that an upload operation has completed. For example, the response message may indicate to the first client device 20a that the multimedia file of various different formats and/or resolutions have been stored in the server 10' or the storage device 40, even though only the single scalable format file has been retained. In an embodiment, the server 10' further transmits a response message to the first client device 20a, which indicates that the generation of a plurality of multimedia objects respectively corresponding to different formats or resolutions has completed.

In operation S250, the first client device 20a transmits a retrieve request to the server 10' to request the provision of a multimedia file with a first resolution. For example, a user of the first client device 20a may send a retrieve request to the server 10' by selecting the second thumbnail 42 illustrated in FIG. 4. In operation S260, the server 10' transmits a read command for a multimedia file with the first resolution to the storage device 40. For example, the server 10' may transmit the read command to the storage device 40 in response to receipt of the retrieve request. In an embodiment, the read command identifies the multimedia file and the desired resolution. In an embodiment, the read command includes the name of the file on the selected thumbnail (e.g., "A.mp4" or "A"). In operation S270, the storage device 40 reads a scalable format file. In operation S280, the storage device 40 transcodes the scalable format file into a multimedia file with the first resolution. In operation S290, the storage device 40 provides the multimedia file with the first resolution to the server 10'. For example, the storage device 40 may load data from the scalable format file, convert the loaded data into a multimedia file of the first resolution, and transmit the multimedia file of the first resolution to the server 10' in response to receipt of the read command. In operation S295, the server 10' provides the multimedia file with the first resolution to the first client device 20a.

Figure 9:
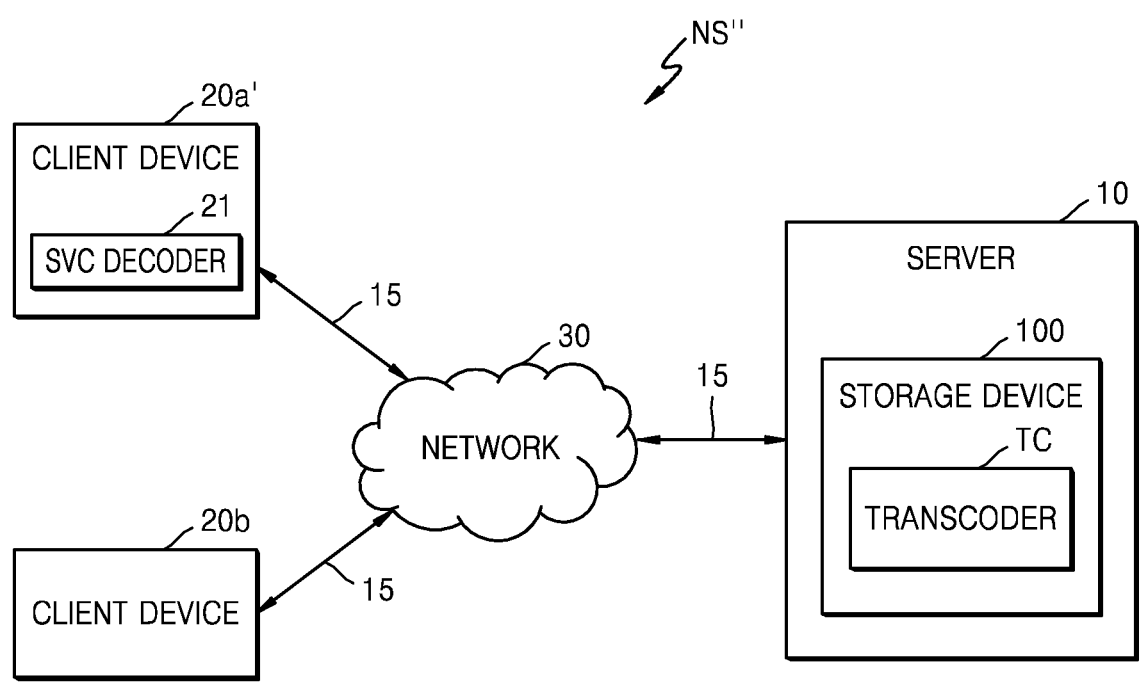
FIG. 9 illustrates a network system according to an exemplary embodiment of the inventive concept.

FIG. 9 illustrates a network system NS" according to an exemplary embodiment of the inventive concept.

Referring to FIG. 9, the network system NS" includes a server 10, a first client device 20a', and a second client device 20b. The network system NS" according to the present embodiment corresponds to a modification of the embodiment of FIG. 1, and the first client device 20a' includes an SVC decoder 21, unlike the first client device 20a shown in FIG. 1. The description given above with reference to FIGS. 1 to 6 may be applied to the present embodiment.

The SVC decoder 21 generates a multimedia file according to a certain format by decoding an SVC format file. Thus, since the first client device 20a' may receive a scalable format file, such as an SVC file, from the server 10, the server 10 may transmit the scalable format file to the first client device 20a' without performing transcoding on a stored scalable format file. For example, the SVC decoder 21 may be implemented by a device that is configured to convert the scalable format file into multimedia files of various different formats and/or resolutions. For example, while the transcoder TC is capable of converting the multimedia file to the scalable format file, the SVC decoder 20 is capable of converting the scalable format file back to the multimedia file.

Figure 10:
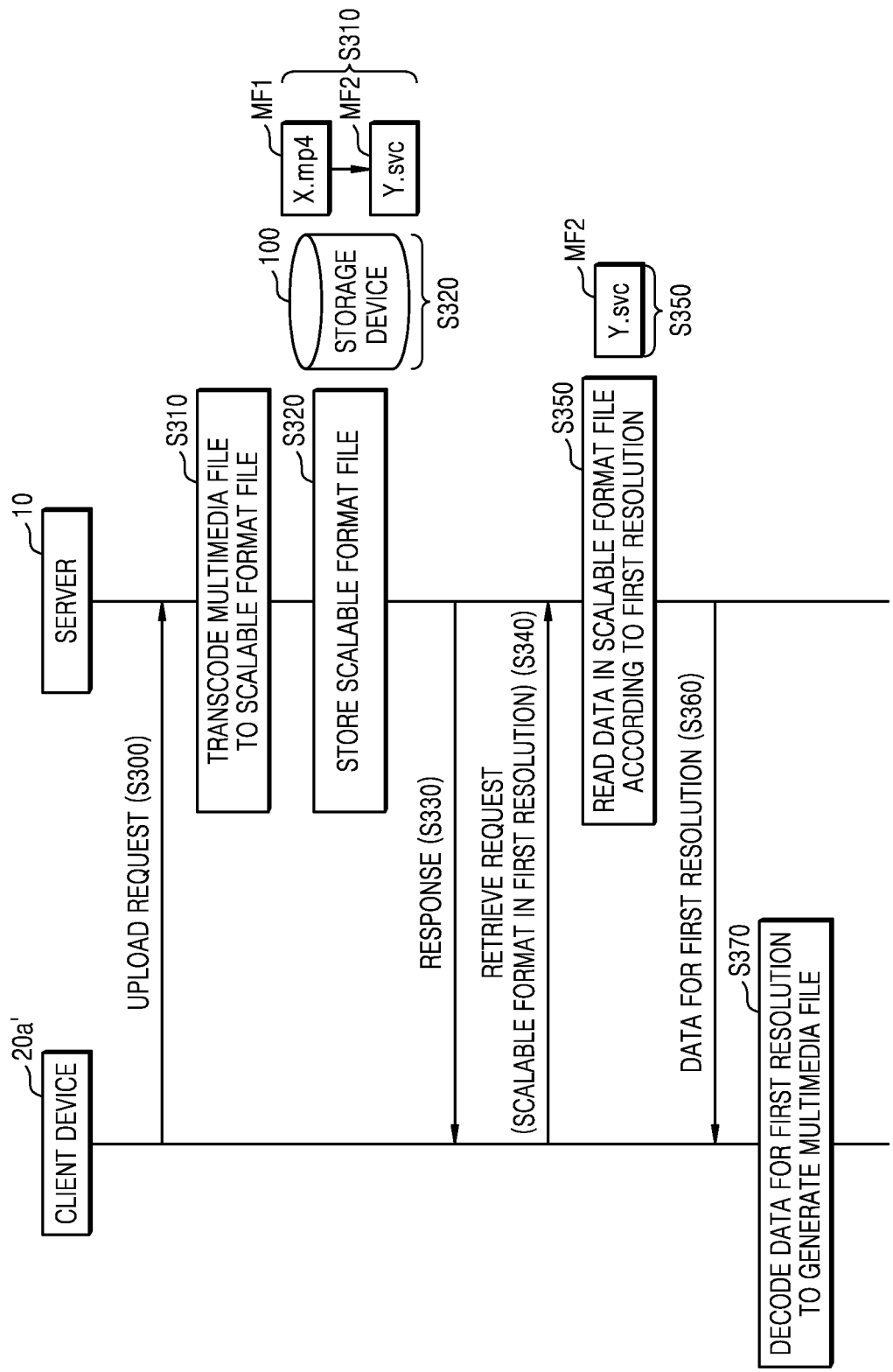
FIG. 10 is a flowchart illustrating an operation between a first client device and a server of FIG. 9, according to an exemplary embodiment of the inventive concept.

FIG. 10 is a flowchart illustrating an operation between the first client device 20a' and the server 10 of FIG. 9, according to an exemplary embodiment of the inventive concept.

Referring to FIG. 10, the operation according to the present embodiment corresponds to a modification of the embodiment illustrated in FIG. 2, and the description given above with reference to FIGS. 2 to 6 may also be applied to the present embodiment. In operation S300, the first client device 20a' transmits a request to the server 10 to upload a multimedia file or a multimedia object. In an embodiment, the first client device 20a' transmits a request to the server 10 to generate an additional object, in addition to the upload request.

In operation S310, the server 10 transcodes a received multimedia file into a scalable format file. In operation S320, the server 10 stores the scalable format file in the storage device 100. In operation S330, the server 10 transmits a response message to the first client device 20a', which indicates that an upload operation has completed. In an embodiment, the server 10 further transmits a response message to the first client device 20a', which indicates that the generation of a plurality of multimedia objects respectively corresponding to different formats or resolutions has completed.

In operation S340, the first client device 20a' transmits a retrieve request to the server 10 to request the provision of a scalable format file with a first resolution. In operation S350, the server 10 reads data of the scalable format file according to the first resolution. In operation S360, the server 10 provides data for the first resolution to the first client device 20a'. In operation S370, the first client device 20a' generates a multimedia file by decoding the data for the first resolution. For example, the first client device 20a' may use the SVC decoder 21 to convert the scalable format file with the first resolution to a multimedia file of a certain format.

Figure 11:
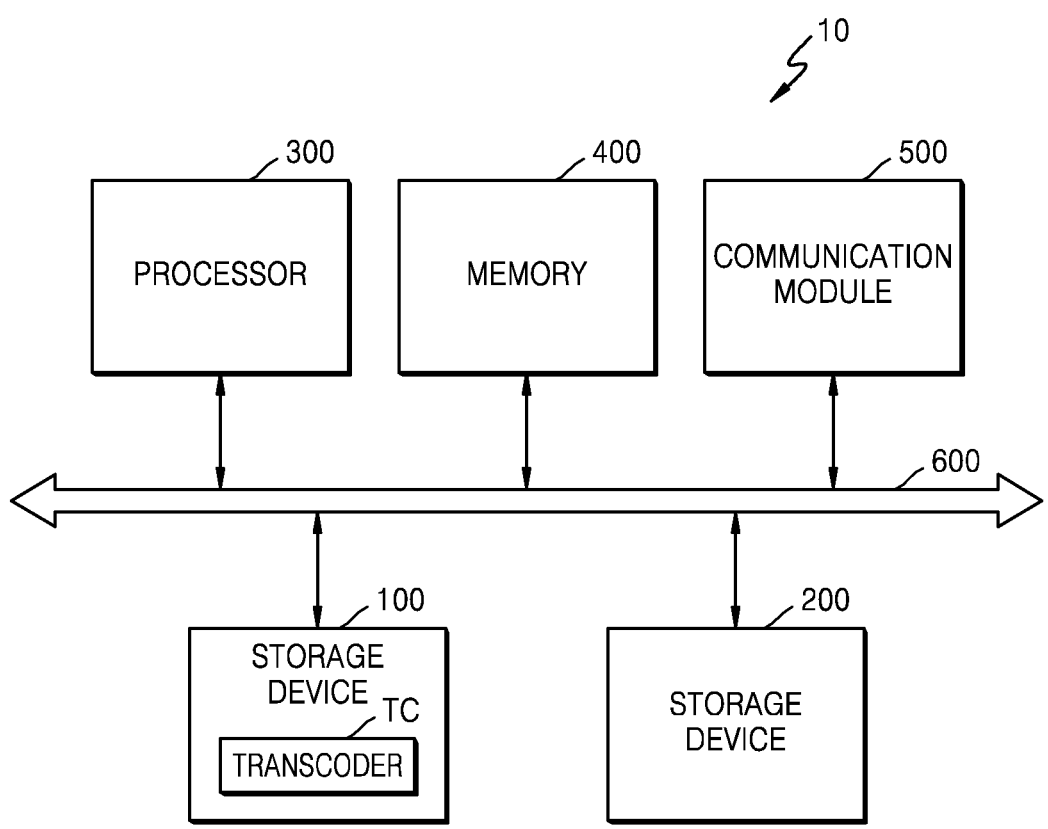
FIG. 11 is a block diagram of a server according to an exemplary embodiment of the inventive concept.

FIG. 11 is a block diagram of a server 10 according to an exemplary embodiment of the inventive concept.

Referring to FIG. 11, the server 10 includes first and second storage devices 100 and 200, a processor 300, a memory 400, and a communication module 500, which may communicate with each other via a bus 600. The first storage device 100 includes a transcoder TC (e.g., a controller, a control circuit, etc.). In an embodiment, the second storage device 200 may be implemented substantially similar to the first storage device 100. However, the inventive concept is not limited thereto, and in some embodiments, the second storage device 200 does not include the transcoder TC.

In some embodiments, components in the server 10 are physically spaced apart from each other and communicate with each other through a network. The server 10 according to the present embodiment may correspond to the server 10 of FIG. 1, and the description given above with reference to FIGS. 1 to 10 may be applied to the present embodiment. In some embodiments, the server 10 may be an integrated server or a distributed server and may be located across a plurality of locations, a plurality of machines, or a plurality of data centers, and may be in a cloud that includes one or more cloud components in one or more networks.

The processor 300 may include hardware for executing instructions constituting a computer program. The memory 400 may include a main memory for storing instructions executed by the processor 300 or data operated by the processor 300. The communication module 500 (e.g., a network card, a transceiver, etc.) may provide a function enabling the first and second client devices 20a and 20b and the server 10 to communicate with each other through the network 30.

Figure 12:
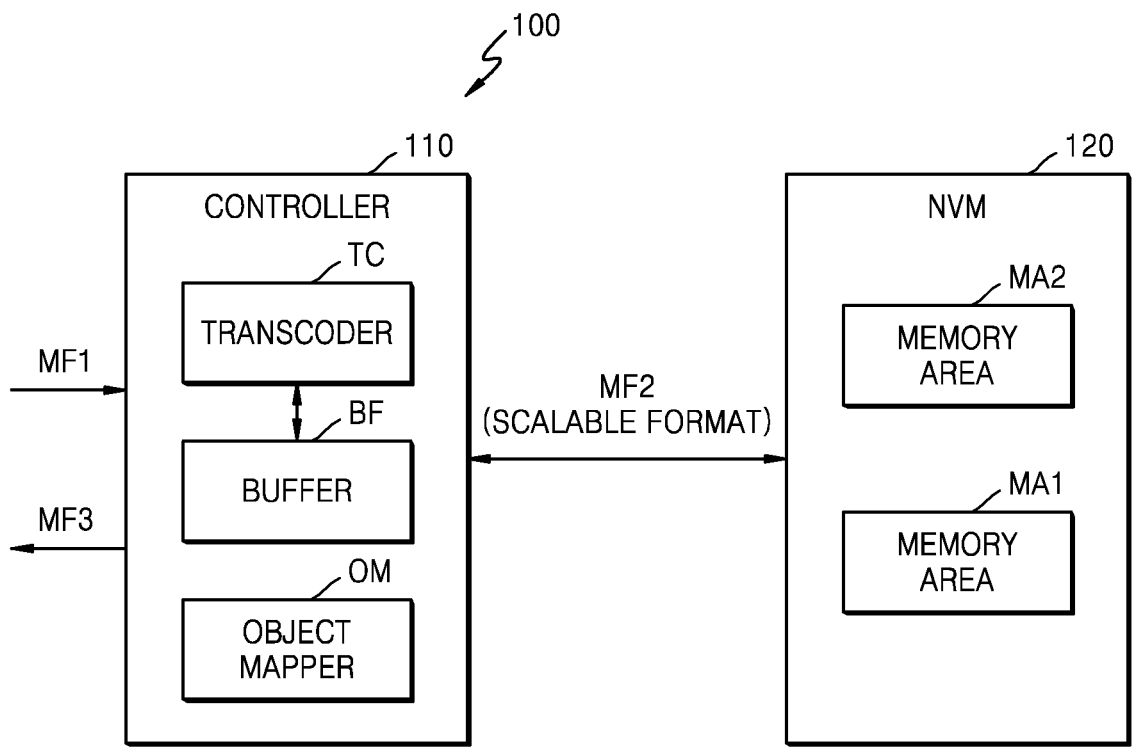
FIG. 12 is a block diagram of a storage device according to an exemplary embodiment of the inventive concept.

FIG. 12 is a block diagram of a storage device 100 according to an exemplary embodiment of the inventive concept.

Referring to FIG. 12, the storage device 100 includes a memory controller 110 (hereinafter, referred to as a controller for convenience) and a non-volatile memory 120. The controller 110 includes a transcoder TC, a buffer BF, and an object mapper OM. Although the buffer BF is shown as being included in the controller 110, the inventive concept is not limited thereto. In some embodiments, the buffer BF is positioned outside the controller 110. For example, the buffer BF may be implemented by a memory device such as a dynamic random access memory (DRAM) chip.

The buffer BF may buffer a first multimedia file MF1 received from the outside. In an embodiment, the first multimedia file MF1 is received from a first client device (e.g., the first client device 20a in FIG. 1) or a second client device (e.g., the second client device 20b in FIG. 1). In an embodiment, the first multimedia file MF1 is received from the non-volatile memory 120. In an embodiment, the first multimedia file MF1 is received from a second storage device (e.g., the second storage device 200 in FIG. 11).

The transcoder TC generates a second multimedia file MF2 by transcoding the first multimedia file MF1, buffered by the buffer BF, from an original format to a scalable format (e.g., an SVC format). The transcoder TC may provide the generated second multimedia file MF2 to the buffer BF. The second multimedia file MF2 provided to the buffer BF may be stored in the non-volatile memory 120.

In an embodiment, the object mapper OM determines a physical address for writing the second multimedia file MF2 into the non-volatile memory 120. In an embodiment, the object mapper OM determines a physical address for writing data corresponding to each layer of the second multimedia file MF2 into the non-volatile memory 120, based on a degree of importance of each layer (e.g., layers BL, EL1, and EL2 in FIG. 13) in the second multimedia file MF2. In an embodiment, the object mapper OM determines a physical address for writing data corresponding to each layer into the non-volatile memory 120, based on a bit rate required for each layer (e.g., layers BL, EL1, and EL2 in FIG. 13) in the second multimedia file MF2.

The non-volatile memory 120 may include a plurality of memory areas including first and second memory areas MA1 and MA2 having different storage reliability levels. In an embodiment, the storage reliability levels are determined based on a result of an error detection and correction operation performed on the plurality of memory areas. In an embodiment, the storage reliability levels are determined based on wear levels of the plurality of memory areas. For example, the first memory area MA1 may have a first storage reliability level and the second memory area MA2 may have a second storage reliability level that is lower than the first storage reliability level.

In an embodiment, the first memory area MA1 includes single level cells (SLCs), and the second memory area MA2 includes multi level cells (MLCs), triple level cells (TLCs), or quadruple level cells (QLCs). For example, the first memory area MA1 may be an SLC block, an SLC die, or an SLC chip, and the second memory area MA2 may be an MLC block, an MLC die, or an MLC chip.

In an embodiment, the program/erase cycle count of the first memory area MA1 is less than or equal to a reference count, and the program/erase cycle count of the second memory area MA2 is greater than the reference count. In an embodiment, the data retention time of the first memory area MA1 is less than or equal to a reference time, and the data retention time of the second memory area MA2 is greater than the reference time. In an embodiment, the number of error correction coding (ECC) result error bits for the first memory area MA1 is less than or equal to a reference number, and the number of ECC result error bits for the second memory area MA2 is greater than the reference number.

In an embodiment, a page, a memory block, a die, or a chip in the first memory area MA1 has a storage reliability level that is degraded over time. Thus, when the storage reliability level of a page, a memory block, a die, or a chip in which data corresponding to a layer (e.g., a base layer) having a high importance degree is written is degraded, the object mapper OM changes a physical address of the data so as to store the data in another page, memory block, die, or chip having a relatively high storage reliability.

The non-volatile memory 120 may include a memory cell array having a plurality of memory blocks, and each of the memory blocks include a plurality of pages. For example, the memory block may be a unit of erase, and the page may be a unit of write and read. In an embodiment, the non-volatile memory 120 includes a flash memory device, for example, a NAND flash memory device. However, the inventive concept is not limited thereto, and the non-volatile memory 120 may include a resistive memory device such as resistive RAM (ReRAM), phase change RAM (PRAM), or magnetic RAM (MRAM).

In an embodiment, the storage device 100 is an object storage device that manages data on an object basis. In an embodiment, the storage device 100 is a key-value storage device or a key-value store and may be, for example, a key-value solid state drive (SSD). The key-value storage device is a device that processes data quickly and simply by using a key-value pair. The "key-value pair" is a pair including a unique key and a value that is data corresponding to the key, and may be referred to as a "tuple" or "key-value tuple". In the key-value pair, the key may be represented by any string, such as a file name, a uniform resource identifier (URI), or a hash, and the value may be any type of data, such as an image, a user preference file, or a document. Hereinafter, embodiments in which the storage device 100 is an object storage device or a key-value storage device will be mainly described. However, the inventive concept is not limited thereto, and the storage device 100 may be a block storage device that manages data on a block basis.

Figure 13:
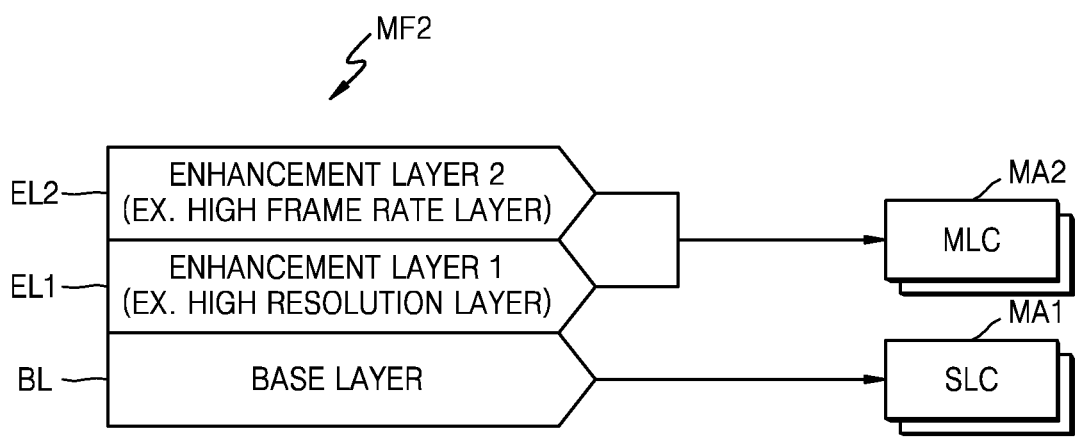
FIG. 13 illustrates an example of a storage operation of layers in a scalable format file, according to an exemplary embodiment of the inventive concept.

FIG. 13 illustrates an example of a storage operation of layers in the second multimedia file MF2 of FIG. 12.

Referring to FIGS. 12 and 13, the second multimedia file MF2 includes a base layer BL, a first enhancement layer EL1, and a second enhancement layer EL2. For example, the first enhancement layer EL1 may correspond to a high-resolution layer, and the second enhancement layer EL2 may correspond to a high-frame-rate layer. A plurality of layers in a scalable format file such as the second multimedia file MF2 may have different importance degrees. For example, the base layer BL may have a highest first importance degree, the first enhancement layer EL1 may have a second importance degree that is lower than the first importance degree, and the second enhancement layer EL2 may have a third importance degree that is lower than the second importance degree. According to an exemplary embodiment of the inventive concept, a storage space in the non-volatile memory 120 is determined differently according to the importance degrees of layers.

In an embodiment, data corresponding to the base layer BL is stored in the first memory area MA1. For example, the first memory area MA1 may include a plurality of SLC chips. In an embodiment, data corresponding to the first and second enhancement layers EL1 and EL2 are stored in the second memory area MA2. The second memory area MA2 may include a plurality of MLC chips.

However, the inventive concept is not limited thereto, and the non-volatile memory 120 may further include a third memory area having a third storage reliability level that is lower than the second storage reliability level. For example, the third memory area may include a plurality of TCL chips. In this case, data corresponding to the first enhancement layer EL1 may be stored in the second memory area MA2, and data corresponding to the second enhancement layer EL2 may be stored in the third memory area.

FIG. 14 is a block diagram of the memory controller 110 of FIG. 12, according to an exemplary embodiment of the inventive concept.

Referring to FIG. 14, the controller 110 includes a processor 111, a memory 112, first and second interfaces 113 and 114, and a buffer BF, which communicate with each other via a bus 115. The processor 111 may include a central processing unit (CPU) or a microprocessor, and may control all operations of the controller 110. In an embodiment, the processor 111 is implemented as a multi-core processor, for example, a dual core processor or a quad core processor.

The memory 112 may operate under the control of the processor 111, and may be used as an operation memory, a buffer memory, or a cache memory. For example, the memory 112 may be implemented as a volatile memory such as DRAM or SRAM, or as a non-volatile memory such as PRAM or a flash memory. In an embodiment, the memory 112 may is loaded with a transcoder TC, an object mapper OM, and a mapping table MT. The transcoder TC may transcode a multimedia file, buffered by the buffer BF, from an original format to a scalable format. The object mapper OM may determine a physical address for writing a transcoded scalable format multimedia file into the non-volatile memory 120 and store the determined physical address in the mapping table MT for each object identification (ID) or object identifier. In an embodiment, each object ID is a unique identifier associated with a given transcoded scalable format multimedia file. The transcoder TC and the object mapper OM may be implemented in firmware or software and loaded into memory 112. However, the inventive concept is not limited thereto, and the transcoder TC and the object mapper OM may be implemented in hardware in other embodiments.

The first interface 113 may provide an interface between the processor 300 and the controller 110. For example, the first interface 113 may provide an interface according to universal serial bus (USB), multimedia card (MMC), peripheral component interconnect-express (PCI-E), AT attachment (ATA), serial AT attachment (SATA), parallel AT attachment (PATA), small computer system interface (SCSI), serial attached SCSI (SAS), enhanced small disk interface (ESDI), or integrated drive electronics (IDE). The second interface 114 may provide an interface between the controller 110 and the non-volatile memory 120. For example, the mapping table MT and a scalable format file such as the second multimedia file MF2 may be transmitted and received between the controller 110 and the non-volatile memory 120 via the second interface 114. In an embodiment, the number of second interfaces 114 may correspond to the number of non-volatile memory chips in the storage device 100 or the number of channels between the controller 110 and the non-volatile memory 120.

Figure 15B:
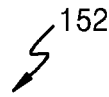
Figure 15C:
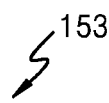

FIGS. 15A to 15C illustrate mapping tables 151 to 153, respectively, according to some embodiments of the inventive concept. For example, the mapping table MT of FIG. 14 may be implemented as one of the mapping tables 151 to 153.

Referring to FIG. 15A, the mapping table 151 stores a physical address (e.g., a physical page number (PPN)) for each object ID. The object mapper OM determines that data corresponding to first to third object IDs OID1 to OID3 is to be written into first to third PPNs PPNa to PPNc, respectively. Each object ID may correspond to a scalable format file. Thus, each scalable format file may correspond to a single physical address.

Referring to FIG. 15B, a mapping table 152 stores a physical address for each layer of an object ID. Thus, each scalable format file may correspond to three physical addresses. The object mapper OM determines that data respectively corresponding to a base layer BL, a first enhancement layer EL1, and a second enhancement layer EL2 in a scalable format file corresponding to the first object ID OID1 is to be written into a PPN11, a PPN12, and a PPN13, respectively. In addition, the object mapper OM determines that data respectively corresponding to a base layer BL, a first enhancement layer EL1, and a second enhancement layer EL2 in a scalable format file corresponding to the second object ID 0ID2 is to be written into a PPN21, a PPN22, and a PPN23, respectively. For example, the PPN11 and the PPN21 may be included in the first memory area MA1, and the PPN12, the PPN13, the PPN22, and the PPN23 may be included in the second memory area MA2.

Referring to FIG. 15C, a mapping table 153 stores a physical address for each bit rate of an object ID. The object mapper OM determines that data corresponding to a first bit rate BR1 required for a first layer in a scalable format file corresponding to the first object ID OID1 is to be written into a PPN 11', data corresponding to a second bit rate BR2 required for a second layer in the scalable format file is to be written into a PPN 12', and data corresponding to a third bit rate BR3 required for a third layer in the scalable format file is to be written into a PPN 13'. For example, the PPN 11' and the PPN 21' may be included in the first memory area MA1, and the PPN 12', the PPN 13', the PPN 22', and the PPN 23' may be included in the second memory area MA2.

Figure 16:
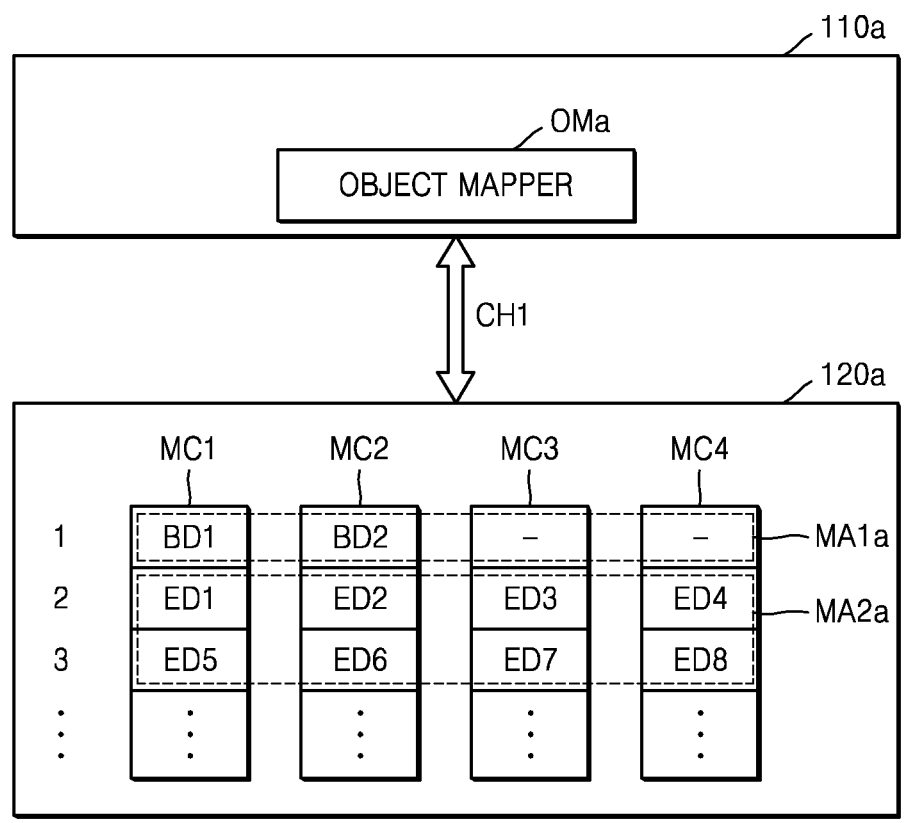
FIG. 16 illustrates an operation of storing data corresponding to each layer included in a scalable format file, according to an exemplary embodiment of the inventive concept.

FIG. 16 illustrates an operation of storing data corresponding to each layer included in a scalable format file, according to an exemplary embodiment of the inventive concept. Referring to FIG. 16, a controller 110a includes an object mapper OMa. Although not shown in FIG. 16, the controller 110a corresponds to a modification of the controller 110 of FIG. 12, and may further include a transcoder TC and a buffer BF. A non-volatile memory 120a corresponds to a modification of the non-volatile memory 120 of FIG. 12, and the controller 110a and the non-volatile memory 120a may be connected to each other through a first channel CH1.

The object mapper OMa may arrange, in first to fourth memory chips MC1 to MC4 in the non-volatile memory 120a, data corresponding to each layer in the scalable format file. In an exemplary embodiment, the object mapper OMa configures a redundant array of inexpensive disk (RAID) stripe to write data corresponding to each layer in the scalable format file into the non-volatile memory 120a. RAID is a method that is mainly used in a storage medium such as a server for storing important data, and is a method for storing parity in one storage medium among a plurality of storage media and restoring normal data even if an error occurs in data stored in another storage medium. A plurality of pieces of data and one or more RAID parities may constitute one RAID stripe. For example, the object mapper OMa may form a stripe based on a plurality of memory chips, a plurality of memory dies, a plurality of memory planes, a plurality of memory blocks, a plurality of pages, or a plurality of sectors.

Since the bit rate of a base layer is relatively low, the object mapper OMa may determine physical addresses for writing of data corresponding to the base layer, based on a relatively small number of memory chips. In an embodiment, the object mapper OMa may arrange, in the first and second memory chips MC1 and MC2, data BD1 and BD2 corresponding to a base layer (e.g., the base layer BL in FIG. 13). For example, the object mapper OMa may form a stripe with respect to a first memory area MA1a of the first and second memory chips MC1 and MC2 to thereby determine physical addresses of the data BD1 and BD2.

Since an enhancement layer has a relatively high bit rate, the object mapper OMa may determine physical addresses for writing of data corresponding to the enhancement layer, based on a relatively large number of memory chips. In an embodiment, the object mapper OMa may arrange, in the first to fourth memory chips MC1 to MC4, data ED1 to ED8 corresponding to first and second enhancement layers (e.g., the first and second enhancement layers EL1 and EL2 in FIG. 13). For example, the object mapper OMa may form a stripe with respect to a second memory area MA2a of the first to fourth memory chips MC1 to MC4 to thereby determine physical addresses of the data ED1 to ED8.

Figure 17:
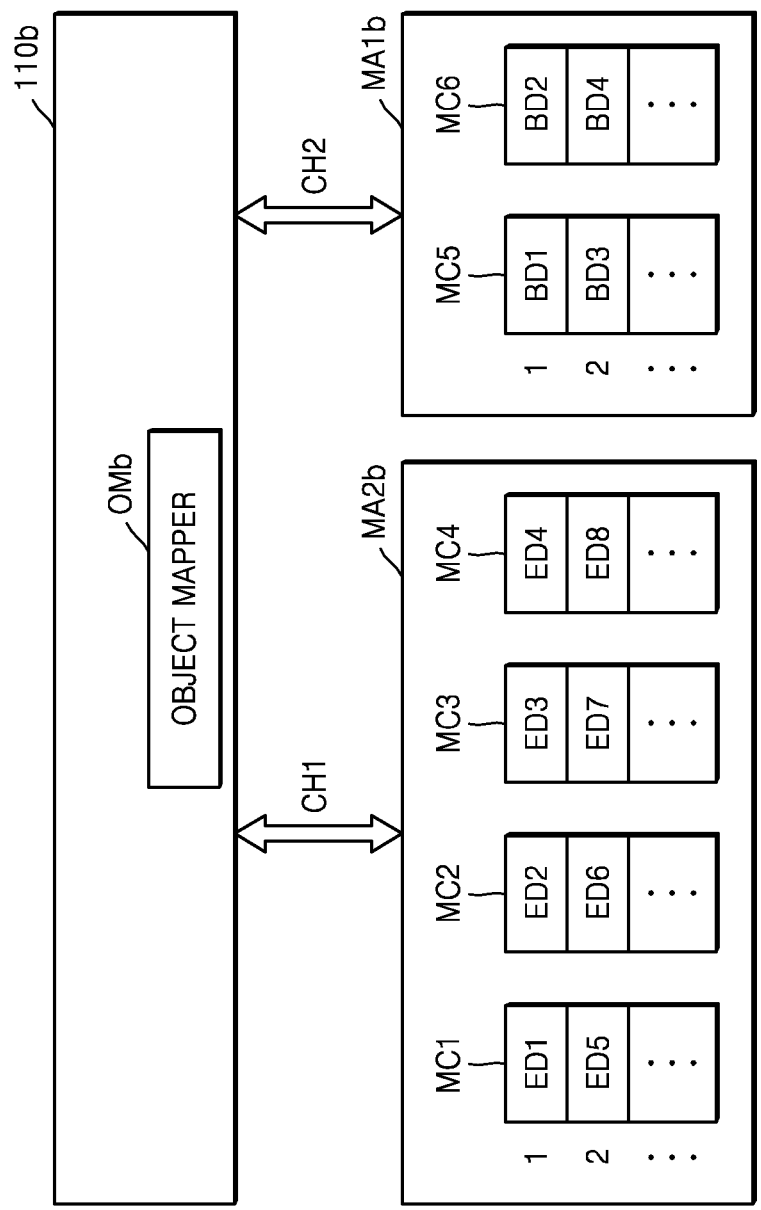
FIG. 17 illustrates an operation of storing data corresponding to each layer included in a scalable format file, according to an exemplary embodiment of the inventive concept.

FIG. 17 illustrates an operation of storing data corresponding to each layer included in a scalable format file, according to an embodiment of the inventive concept. Referring to FIG. 17, a controller 110b includes an object mapper OMb. The controller 110b according to the present embodiment corresponds to a modification of the controller 110a in FIG. 16. The object mapper OMb may arrange, in first to sixth memory chips MC1 to MC6 in the non-volatile memory 120a, data corresponding to each layer in a scalable format file. According to the present embodiment, the object mapper OMb may arrange, in memory chips connected to the controller 110b through different channels, data requiring different bit rates. Thus, the controller 110b may further improve a reading speed when all data requiring different bit rates are read.

Specifically, the object mapper OMb may arrange, in a second memory area MA2b connected to the controller 110b through a first channel CH1, physical addresses for writing of data corresponding to an enhancement layer. In an embodiment, the object mapper OMb may arrange, in the first to fourth memory chips MC1 to MC4 connected to the controller 110b through the first channel CH1, data ED1 to ED8 corresponding to first and second enhancement layers (e.g., the first and second enhancement layers EL1 and EL2 in FIG. 13). For example, the object mapper OMb may form a stripe based on the first to fourth memory chips MC1 to MC4 in the second memory area MA2b to thereby determine physical addresses of the data ED1 to EDB.

In addition, the object mapper OMb may arrange, in a first memory area MA1b connected to the controller 110b through a second channel CH2, physical addresses for writing of data corresponding to a base layer. In an embodiment, the object mapper OMb may arrange, in the fifth and sixth memory chips MC5 and MC6, data BD1 to BD4 corresponding to a base layer (e.g., the base layer BL in FIG. 13). For example, the object mapper OMb may form a stripe based on the fifth and sixth memory chips MC5 and MC6 in the first memory area MA1b to thereby determine physical addresses of the data BD1 to BD4.

Figure 18:
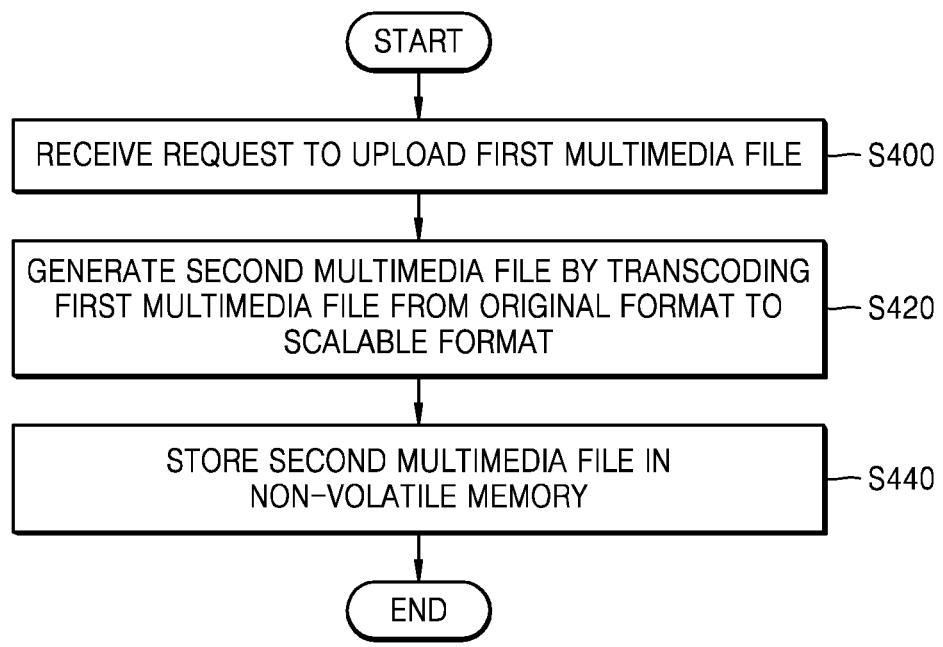
FIG. 18 is a flowchart illustrating a method of storing a multimedia file, according to an exemplary embodiment of the inventive concept.

FIG. 18 is a flowchart illustrating a method of storing a multimedia file, according to an exemplary embodiment of the inventive concept. Referring to FIG. 18, the method of storing a multimedia file according to the present embodiment may include, for example, operations performed in a time-series manner in the storage device 100 of FIG. 12. Thus, the contents described above with reference to FIGS. 12 to 17 may be applied to the present embodiment, and redundant description will be omitted. In operation S400, the storage device 100 receives a request to upload a first multimedia file. In operation S420, the storage device 100, for example, the transcoder TC generates a second multimedia file by transcoding the first multimedia file from an original format to a scalable format. In operation S440, the storage device 100 stores the second multimedia file in the non-volatile memory 120.

Figure 19:
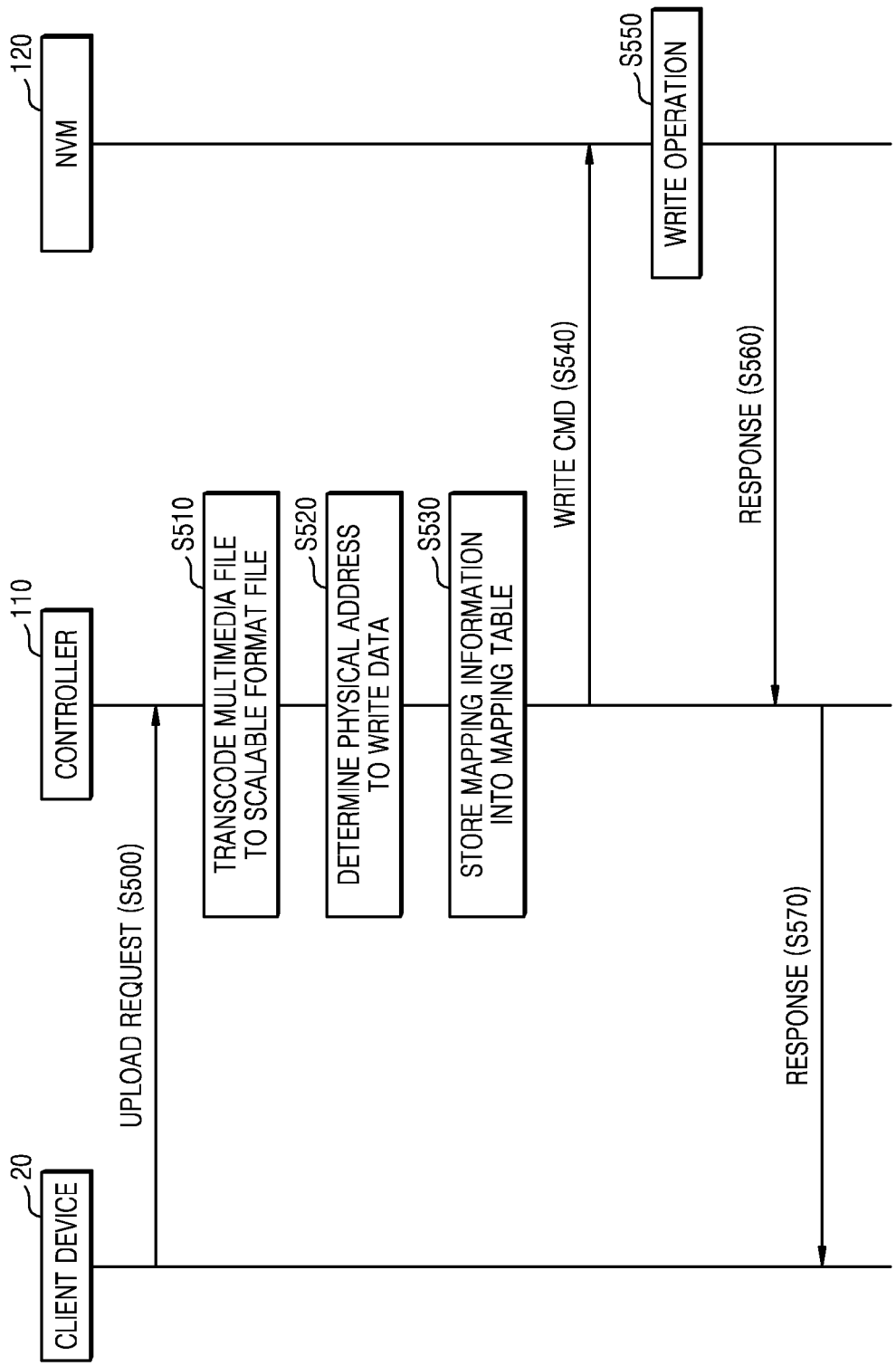
FIG. 19 is a flowchart illustrating an operation between a client device, a controller, and a non-volatile memory, according to the storage method illustrated in FIG. 18.

FIG. 19 is a flowchart illustrating an operation between a client device 20, a controller 110, and a non-volatile memory 120, according to the storage method illustrated in FIG. 18. According to FIG. 19, the client device 20 may correspond to the first client device 20a or the second client device 20b of FIG. 1, and the controller 110 and the non-volatile memory 120 may respectively correspond to the controller 110 and the non-volatile memory 120 of FIG. 12.

In operation S500, the client device 20 transmits a request to the controller 110 to upload a multimedia object or a multimedia file. Specifically, the client device 20 may transmit an upload request to a server (e.g., the server 10 in FIG. 1) over the network, and the server may transmit the upload request to the controller 110. However, for the sake of convenience of description, the operation between the client device 20 and the server and the operation between the server and the controller 110 will be omitted, and the operation between the client device 20 and the controller 110 will be mainly described.

In operation S510, the controller 110, for example, the transcoder TC transcodes a multimedia file into a scalable format file. In operation S520, the controller 110, for example, the object mapper OM determines a physical address for writing of data corresponding to the scalable format file. In operation S530, the controller 110 stores mapping information in a mapping table (e.g. the mapping table MT in FIG. 14). In operation S540, the controller 110 transmits a write command for the scalable format file to the non-volatile memory 120. In operation S550, the non-volatile memory 120 performs a write operation on the scalable format file. In operation S560, the non-volatile memory 120 transmits a response message to the controller 110 indicating the completion of the write operation. In operation S570, the controller 110 transmits a response message to the client device 20 indicating the completion of an upload operation.

Figure 20:
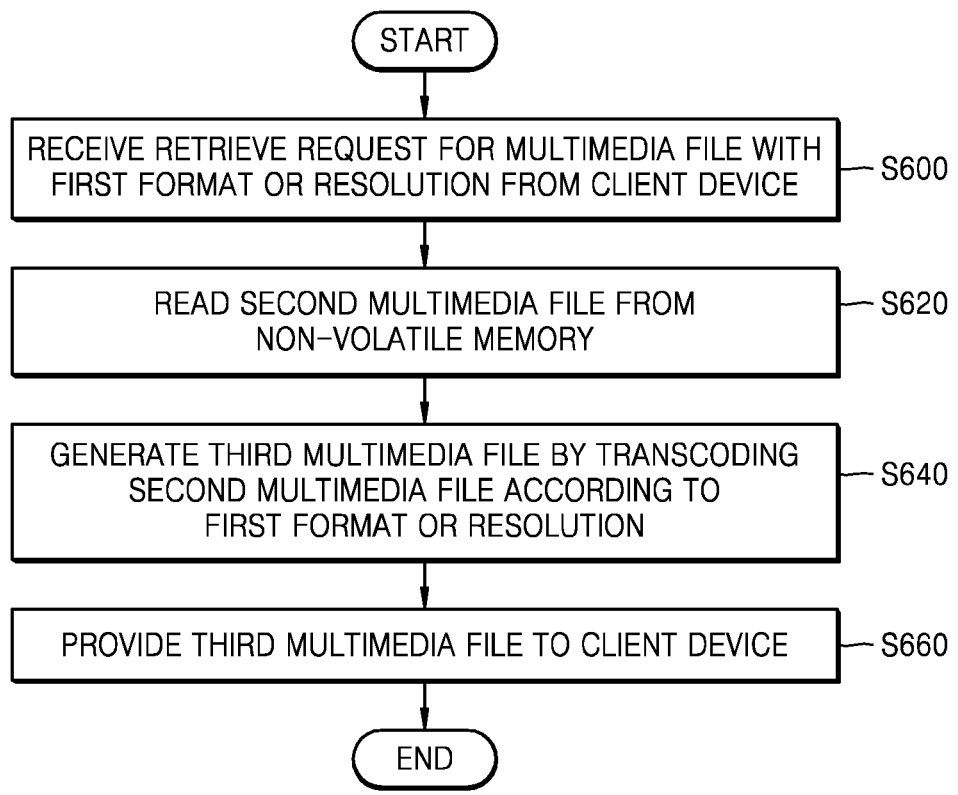
FIG. 20 is a flowchart illustrating a method of reading a multimedia file, according to an exemplary embodiment of the inventive concept.

FIG. 20 is a flowchart illustrating a method of reading a multimedia file, according to an exemplary embodiment of the inventive concept. Referring to FIG. 20, the method of reading a multimedia file according to the present embodiment may include, for example, operations performed in a time-series manner in the storage device 100 of FIG. 12. Thus, the contents described above with reference to FIGS. 12 to 17 may be applied to the present embodiment, and redundant description will be omitted.

In operation S600, the storage device 100 receives a retrieve request for a multimedia file with a first format or resolution from a client device. In operation S620, the storage device 100 reads a second multimedia file from the non-volatile memory 120. In operation S640, the storage device 100, for example, the transcoder TC generates a third multimedia file by transcoding the second multimedia file according to the first format or resolution. In operation S660, the storage device 100 provides the third multimedia file to the client device.

Figure 21:
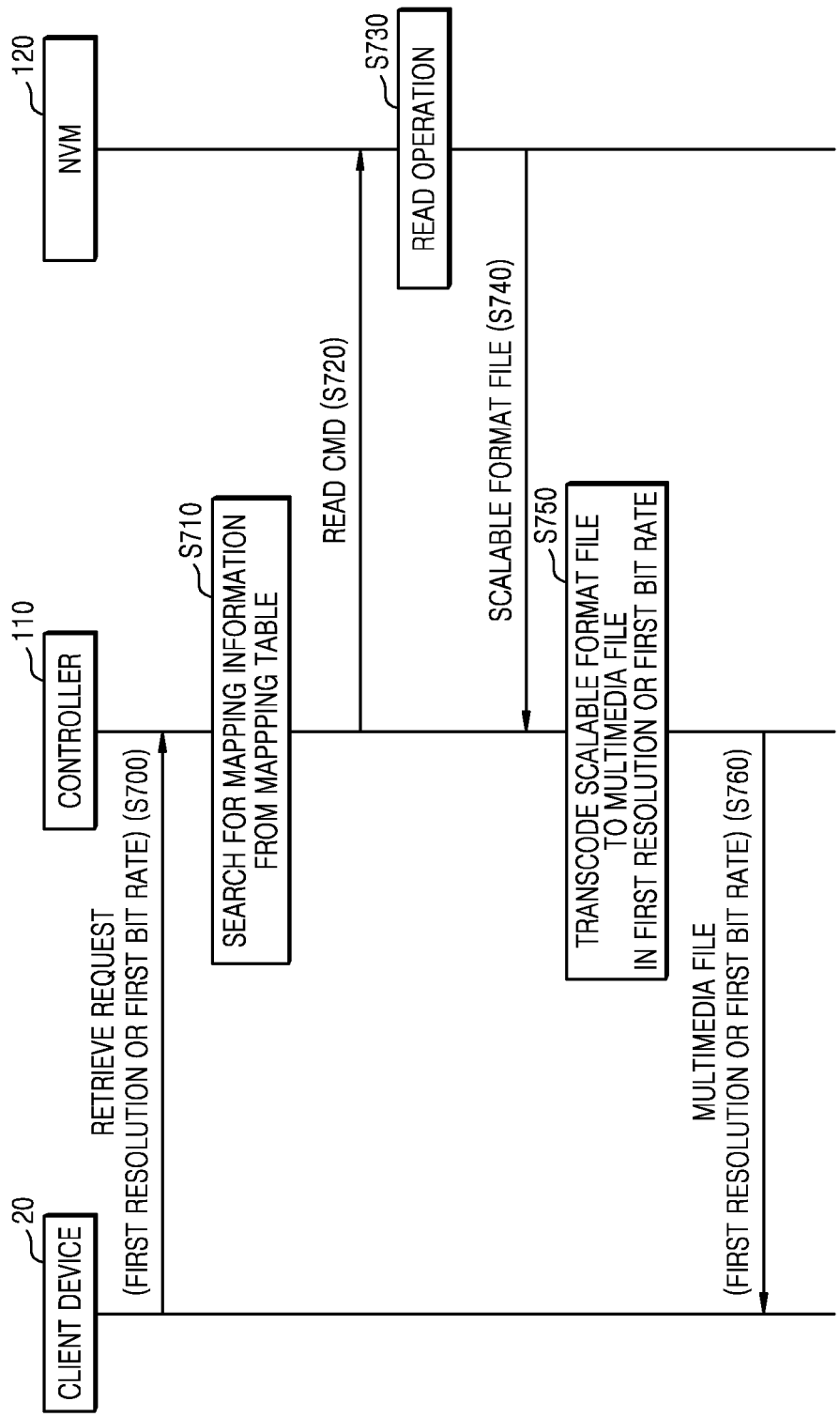
FIG. 21 is a flowchart illustrating an example of an operation between a client device, a controller, and a non-volatile memory, according to the reading method illustrated in FIG. 20.

FIG. 21 is a flowchart illustrating an example of an operation between a client device 20, a controller 110, and a non-volatile memory 120, according to the reading method illustrated in FIG. 20. Referring to FIG. 21, the client device 20 may correspond to the first client device 20a or the second client device 20b of FIG. 1, and the controller 110 and the non-volatile memory 120 may respectively correspond to the controller 110 and the non-volatile memory 120 of FIG. 12.

In operation S700, the client device 20 transmits a retrieve request to the controller for a multimedia file having a first resolution or a first bit rate. In an embodiment, the client device 20 transmits a retrieve request to a server (e.g., the server 10 in FIG. 1) over the network, and the server transmits the retrieve request to the controller 110. In operation S710, the controller 110 retrieves mapping information from a mapping table (e.g. the mapping table MT in FIG. 14). In operation S720, the controller 110 transmits a read command to the non-volatile memory 120 based on the retrieved mapping information.

In operation S730, the non-volatile memory 120 performs a read operation. In operation S740, the non-volatile memory 120 provides a scalable format file to the controller 110. In operation S750, the controller 110, for example, the transcoder TC transcodes the scalable format file into a multimedia file with a first resolution or a first bit rate. In operation S760, the controller 110 provides the client device 20 with the multimedia file with the first resolution or the first bit rate.

Figure 22:
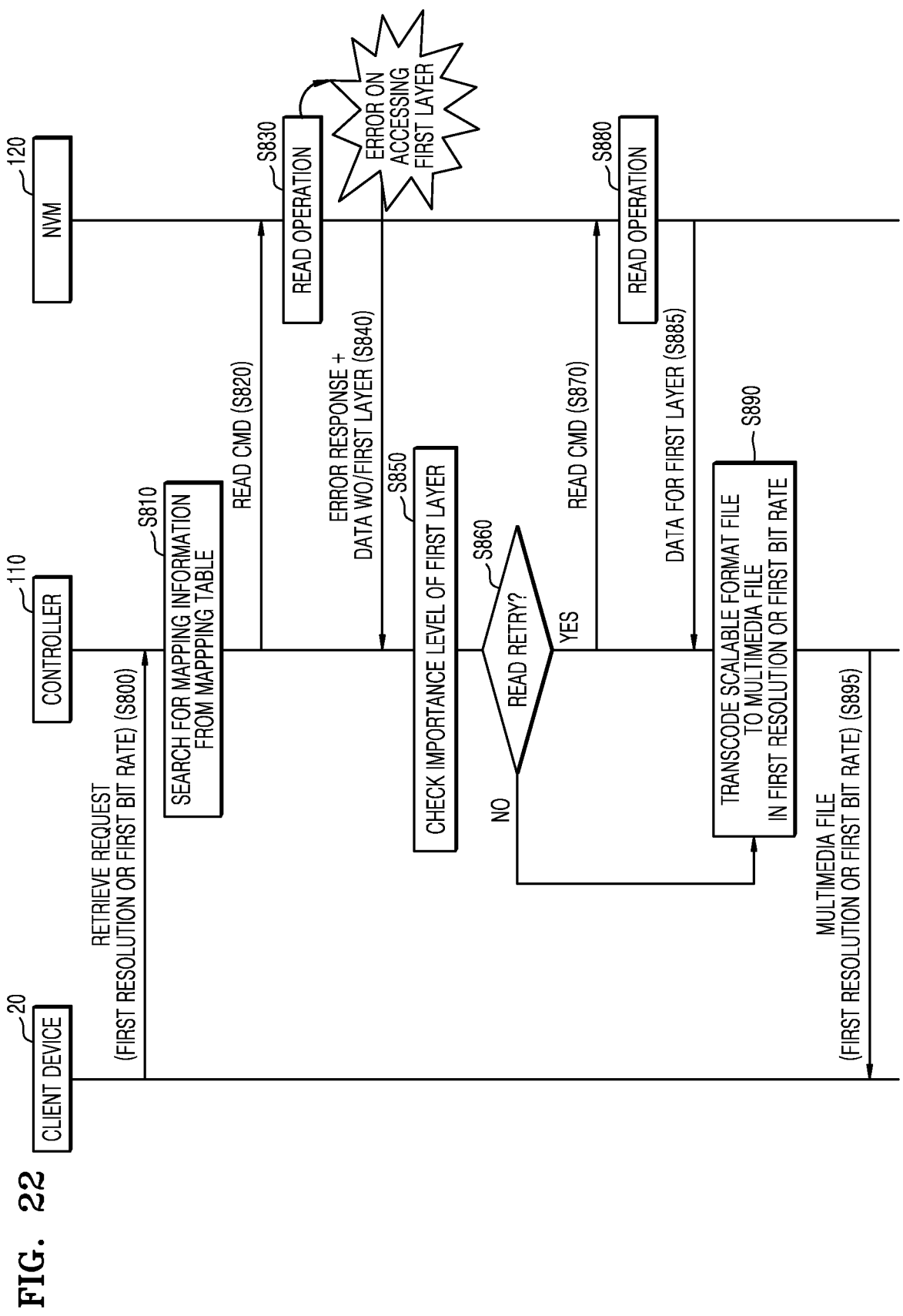
FIG. 22 is a flowchart illustrating another example of the operation between the client device, the controller, and the non-volatile memory, according to the reading method illustrated in FIG. 20.

FIG. 22 is a flowchart illustrating another example of the operation between the client device 20, the controller 110, and the non-volatile memory 120, according to the reading method illustrated in FIG. 20.

Referring to FIG. 22, in operation S800, the client device 20 transmits a retrieve request to the controller for a multimedia file having a first resolution or a first bit rate. In operation S810, the controller 110 retrieves mapping information from a mapping table. In operation S820, the controller 110 transmits a read command to the non-volatile memory 120 based on the retrieved mapping information. In operation S830, the non-volatile memory 120 performs a read operation. As a result of performing the read operation, an error may occur in data corresponding to a first layer of a scalable format file stored in the non-volatile memory 120. In an embodiment, the non-volatile memory 120 detects the occurrence of the error and provides a result of the detection to the controller 110. However, the inventive concept is not limited thereto, and in some embodiments, the non-volatile memory 120 may provide only read data to the controller 110 and the controller 110 may detect the occurrence of the error.

In operation S840, the non-volatile memory 120 provides the controller 110 with data corresponding to at least one layer except for the first layer and an error message indicating that an error has occurred in data corresponding to the first layer. In operation S850, the controller 110 checks the importance level of the first layer. In an embodiment, a read retry is performed when the importance level of the first layer is greater than or equal to a reference level, and a read retry is not performed when the importance level of the first layer is less than the reference level. In an embodiment, the number of read retries is determined differently according to the importance level of the first layer.

In operation S860, it is determined whether to perform a read retry. As a result of the determination, when the read retry is not performed, operation S890 is performed. In this case, in operation S890, the controller 110 transcodes the scalable format file into a multimedia file having the first resolution or the first bit rate, based on data corresponding to at least one layer except for the first layer. When the importance level of a layer is relatively low, a read retry for the layer may be omitted and a multimedia file may be formed based on only data corresponding to a layer in which no error has occurred, and be provided to the client device 20. Thus, the client device 20 may receive a streaming service without latency jitter.

As a result of the determination, when the read retry is performed, the controller 110 transfers a read command to the non-volatile memory 120 in operation S870. In operation S880, the non-volatile memory 120 performs a read operation. In operation S885, the non-volatile memory 120 provides the controller 110 with read data corresponding to the first layer. In operation S890, the controller 110 transcodes a scalable format file into a multimedia file having the first resolution or the first bit rate, based on the previously provided data and the data corresponding to the first layer. In operation S895, the controller 110 provides the client device 20 with the multimedia file having the first resolution or the first bit rate. When normal data corresponding to the first layer is not read even if the number of read retries determined for the first layer has reached a threshold value, the controller 110 may transmit an error message to the client device 20.

In the above, an embodiment, in which the controller 110 determines an importance degree for each layer in a scalable format file and determines the number of read retries according to the importance degree for each layer, has been described. However, the inventive concept is not limited thereto, and in some embodiments, the controller 110 may determine an importance degree for each frame in a scalable format file and determine the number of read retries according to the importance degree for each frame. For example, when the importance degree of an I-frame or a P-frame is determined to be higher than the importance degree of a B-frame and an error occurs in data corresponding to the I-frame or the P-frame, the number of read retries may be determined to be relatively high.

Figure 23:
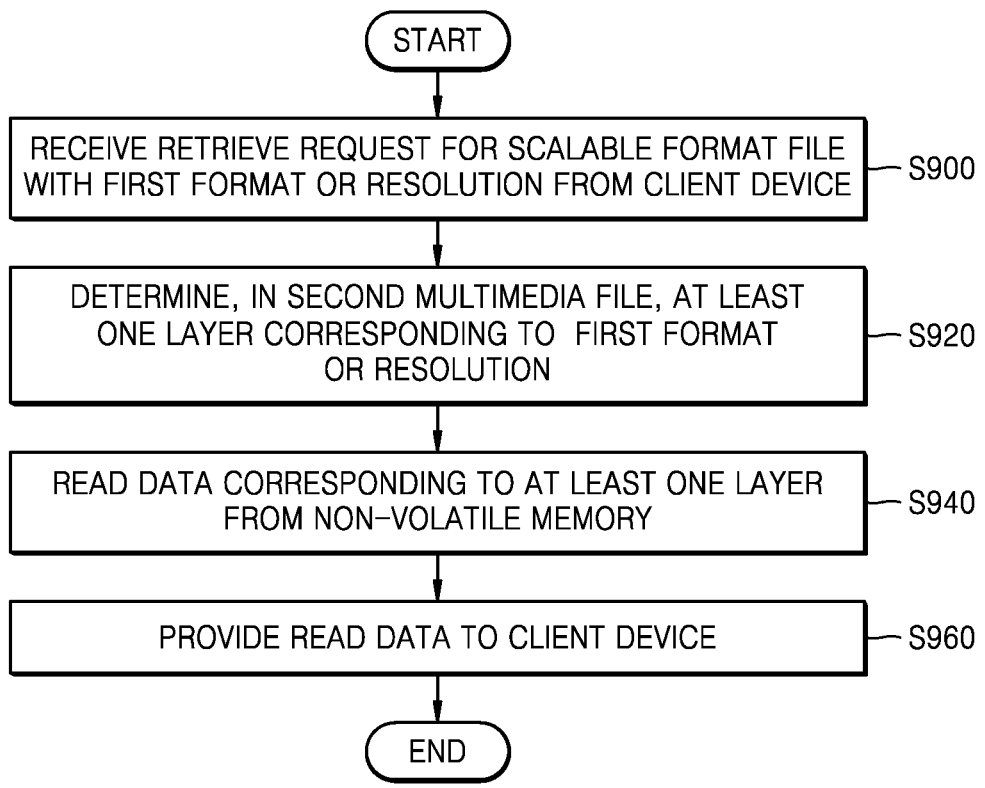
FIG. 23 is a flowchart illustrating a method of reading a multimedia file, according to an exemplary embodiment of the inventive concept.

FIG. 23 is a flowchart illustrating a method of reading a multimedia file, according to an exemplary embodiment of the inventive concept. Referring to FIG. 23, the method of reading a multimedia file according to the present embodiment may include, for example, operations performed in a time-series manner in the storage device 100 of FIG. 12. Thus, the contents described above with reference to FIGS. 12 to 17 may be applied to the present embodiment. The present embodiment may correspond to a modification of the method illustrated in FIG. 20.

In operation S900, the storage device 100 receives a retrieve request for a scalable format file with a first format or resolution from a client device. In operation S920, the storage device 100 determines, in a second multimedia file, at least one layer corresponding to the first format or resolution. In operation S940, the storage device 100 reads data corresponding to the at least one layer from a non-volatile memory. In operation S960, the storage device 100 provides the read data to the client device.

Figure 24:
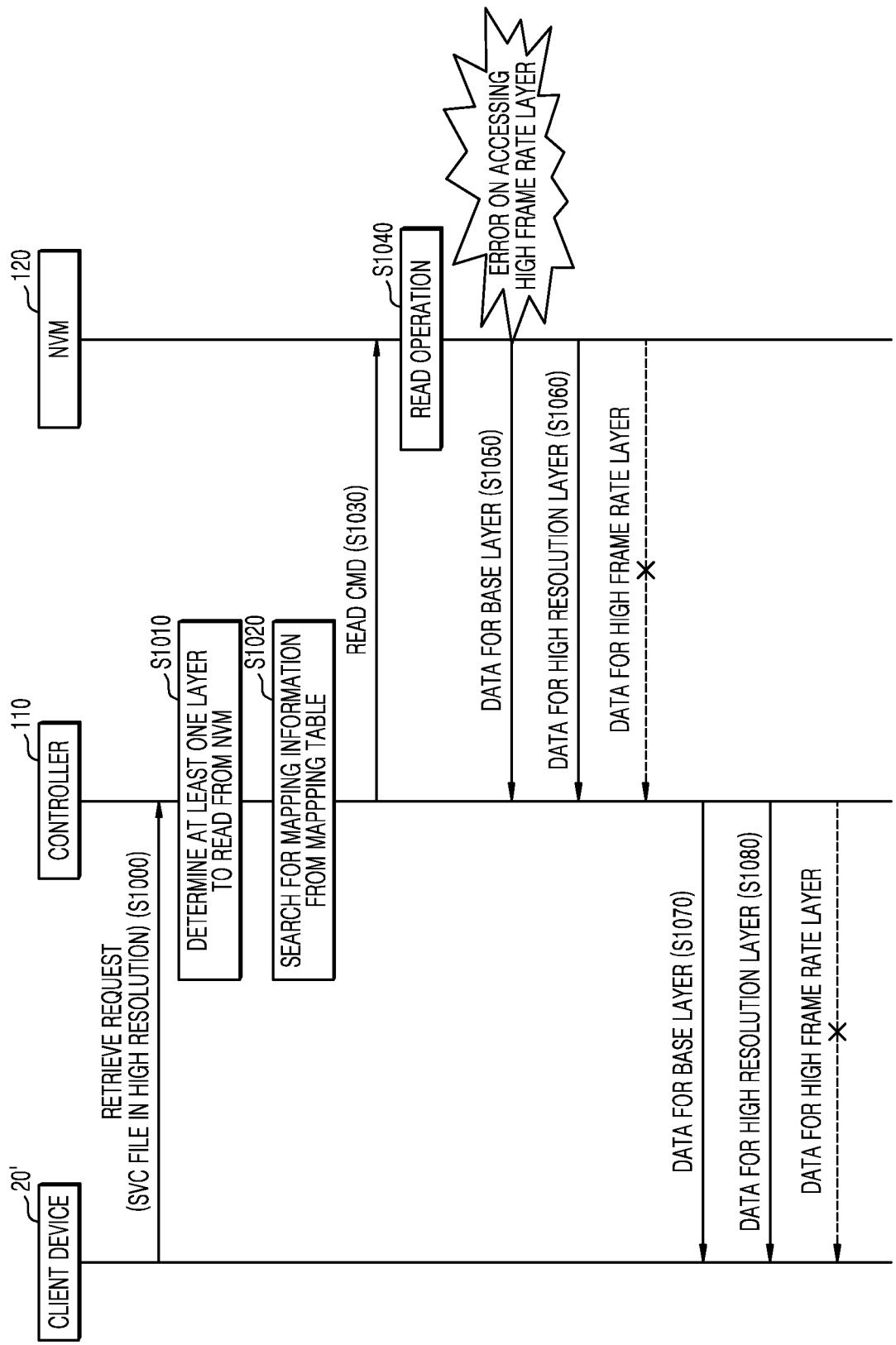
FIGS. 24 to 26 are flowcharts respectively illustrating examples of an operation between a client device, a controller, and a non-volatile memory, according to the reading method illustrated in FIG. 23.

FIG. 24 is a flowchart illustrating an example of an operation between a client device 20', a controller 110, and a non-volatile memory 120, according to the reading method illustrated in FIG. 23. Referring to FIG. 24, the client device 20' may correspond to the first client device 20a' of FIG. 9, and the controller 110 and the non-volatile memory 120 may correspond to the controller 110 and the non-volatile memory 120 of FIG. 12, respectively.

In operation S1000, the client device 20' provides the controller 110 with a retrieve request for a scalable format file with a certain resolution. For example, the client device 20' may provide the controller 110 with a retrieve request for a high resolution SVC file. In operation S1010, the controller 110 determines at least one layer to read from the non-volatile memory 120 in response to the retrieve request. For example, the controller 110 may determine that only a base layer and a high resolution layer among a plurality of layers in a scalable format file are to be read. Accordingly, a data input/output time between the controller 110 and the non-volatile memory 120 may be reduced.

In operation S1020, the controller 110 retrieves mapping information from a mapping table (e.g. the mapping table MT in FIG. 14). For example, the controller 110 may search in the mapping table for only a physical address where data corresponding to the base layer and the high resolution layer are stored. In operation S1030, the controller 110 transmits a read command to the non-volatile memory 120 based on the retrieved mapping information. In operation S1040, the non-volatile memory 120 performs a read operation. Even if an error occurs in data corresponding to a high frame rate layer of a scalable format file stored in the non-volatile memory 120, it is not necessary to read the data corresponding to the high frame rate layer according to the retrieve request, and thus, a read result is not affected.

In operation S1050, the non-volatile memory 120 provides the controller 110 with data corresponding to the base layer. In operation S1060, the non-volatile memory 120 provides the controller 110 with data corresponding to the high resolution layer. In this case, the non-volatile memory 120 does not have to provide the controller 110 with data corresponding to a high frame rate layer. In operation S1070, the controller 110 provides the client device 20' with data corresponding to the base layer. In operation S1080, the controller 110 provides the client device 20' with data corresponding to the high resolution layer. In this case, the controller 110 does not have to provide the client device 20' with data corresponding to the high frame rate layer.

Figure 25:
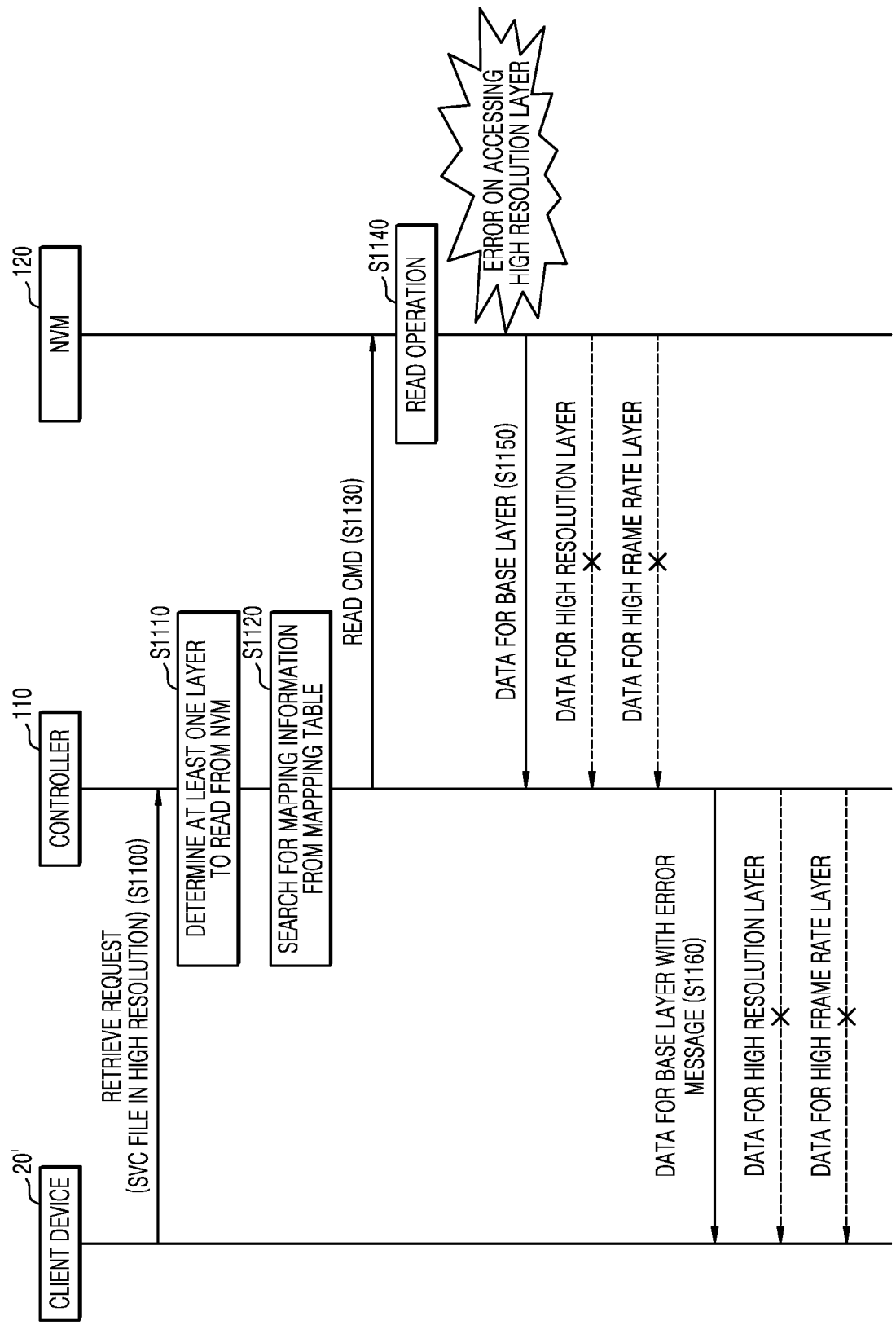

FIG. 25 is a flowchart illustrating an example of an operation between a client device 20', a controller 110, and a non-volatile memory 120, according to the reading method illustrated in FIG. 23.

Referring to FIG. 25, in operation S1100, the client device 20' provides the controller 110 with a retrieve request for a scalable format file with a certain resolution. For example, the client device 20' may provide the controller 110 with a retrieve request for a high resolution SVC file. In operation S1110, the controller 110 determines at least one layer to read from the non-volatile memory 120 in response to the retrieve request. For example, the controller 110 may determine that only a base layer and a high resolution layer among a plurality of layers in a scalable format file are to be read.

In operation S1120, the controller 110 retrieves mapping information from a mapping table (e.g. the mapping table MT in FIG. 14). For example, the controller 110 may search in the mapping table for only a physical address where data corresponding to the base layer and the high resolution layer are stored. In operation S1130, the controller 110 transmits a read command to the non-volatile memory 120 based on the retrieved mapping information. In operation S1140, the non-volatile memory 120 performs a read operation. As a result of performing the read operation, an error may occur in data corresponding to a high resolution layer of a scalable format file stored in the non-volatile memory 120.

In operation S1150, the non-volatile memory 120 provides the controller 110 with data corresponding to the base layer. In this case, the non-volatile memory 120 does not provide the controller 110 with data corresponding to a high resolution layer in which an error has occurred. In operation S1160, the controller 110 provides data corresponding to the base layer to the client device 20'. Accordingly, a user of the client device 20' cannot reproduce a multimedia file according to a requested resolution but may reproduce a multimedia file having a relatively low resolution by performing SVC decoding based on the data corresponding to the base layer. In operation 1160, the controller 110 may additionally provide an error message to the client device 20' indicating that data corresponding to the high resolution layer and data corresponding to the high frame rate layer could not be retrieved.

However, the inventive concept is not limited thereto, and in some embodiments, the controller 110 further reads data corresponding to a high frame rate layer from the non-volatile memory 120, and the controller 110 may provide the client device 20' with data corresponding to the high frame rate layer, in which an error has occurred, along with data corresponding to a base layer. Accordingly, a user of the client device 20' cannot reproduce a multimedia file according to a requested resolution but may reproduce a multimedia file having a different resolution by performing SVC decoding based on the data corresponding to the base layer and the data corresponding to the high frame rate layer.

Figure 26:
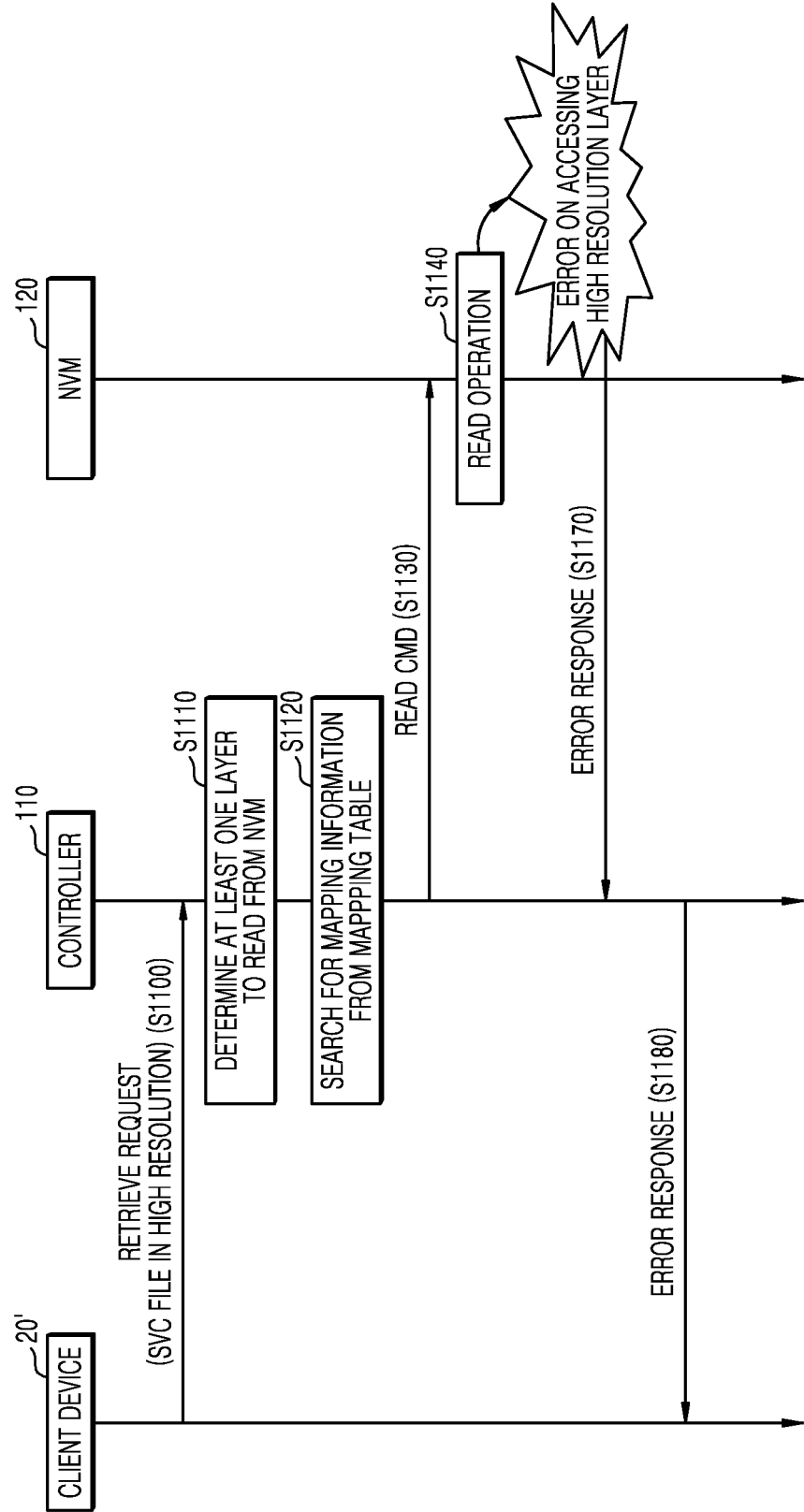

FIG. 26 is a flowchart illustrating an example of an operation between a client device 20', a controller 110, and a non-volatile memory 120, according to the reading method illustrated in FIG. 23. Referring to FIG. 26, as a result of performing a read operation in the non-volatile memory 120, an error may occur in data corresponding to a high resolution layer of a scalable format file stored in the non-volatile memory 120. In operation S1170, the non-volatile memory 120 provides the controller 110 with an error message indicating that an error has occurred in a high resolution layer. In this case, the non-volatile memory 120 does not provide the controller 110 with data corresponding to a base layer even though no error has occurred in the base layer, and does not provide the controller with data corresponding to a high resolution layer in which an error has occurred. In operation S1180, the controller 110 provides the error message to the client device 20'.

Figure 27:
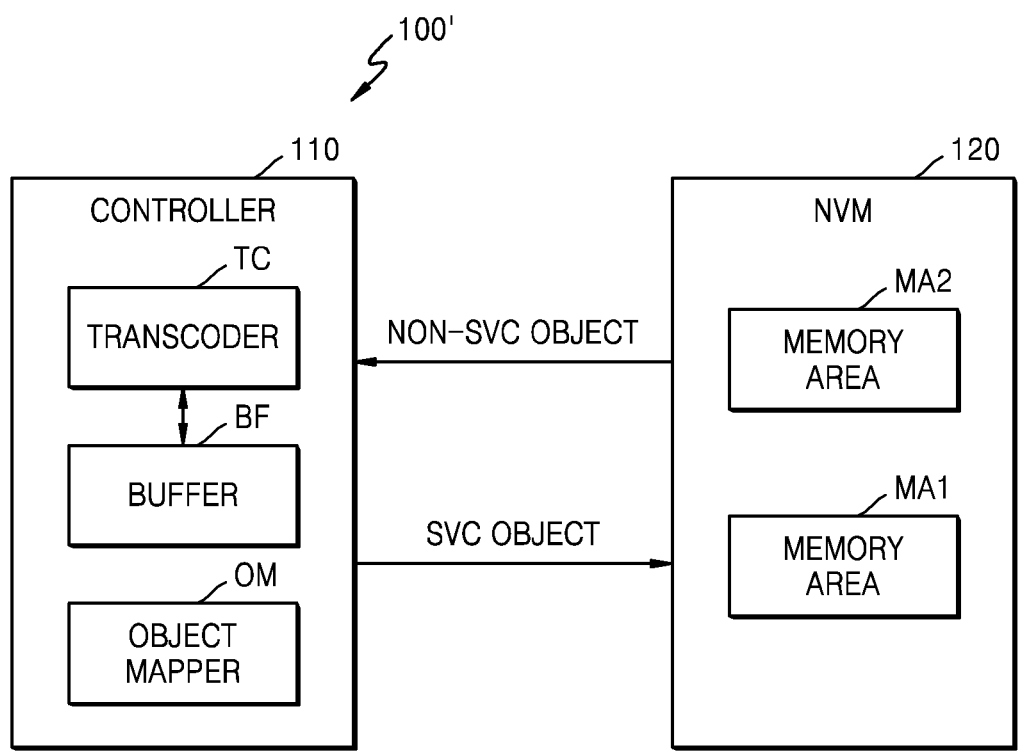
FIG. 27 is a block diagram of a storage device according to an exemplary embodiment of the inventive concept.

FIG. 27 is a block diagram of a storage device 100' according to an exemplary embodiment of the inventive concept.

Referring to FIG. 27, the storage device 100' is substantially similar to the storage device 100 of FIG. 12, and a detailed description of each component will be omitted. According to the present embodiment, a controller 110 searches in a mapping table (e.g. the mapping table MT in FIG. 14) for a physical address where a non-scalable format file having no scalable format among files stored in the non-volatile memory 120 is written. For example, the non-scalable format file may be a non-SVC object. The controller 110 may read a non-SVC object from the non-volatile memory 120 according to a searched physical address.

The controller 110, in particular, a transcoder TC may generate a scalable format file by transcoding a non-SVC object from an original format to a scalable format. For example, the scalable format file may be an SVC object. The controller 110, in particular, an object mapper OM may determine a physical address according to an object ID corresponding to the SVC object and store determined mapping information in the mapping table. The controller 110 may store the SVC object in the non-volatile memory 120.

According to an embodiment, the storage device 100' transcodes a non-SVC object stored in a first memory chip in the non-volatile memory 120 into an SVC object and stores the SVC object in a second memory chip in the non-volatile memory 120. According to an embodiment, the storage device 100' transcodes a non-SVC object stored in a first memory block in the non-volatile memory 120 into an SVC object and stores the SVC object in a second memory block included in the non-volatile memory 120.

Figure 28:
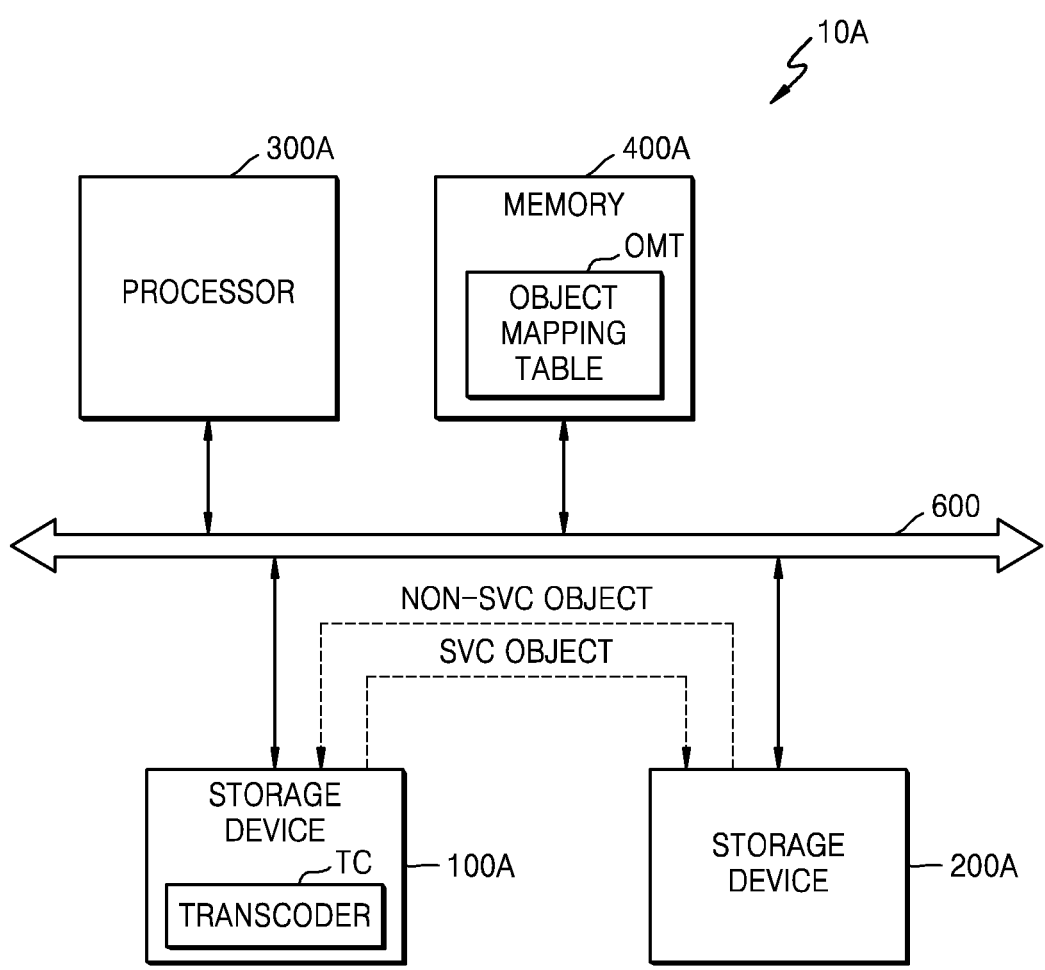
FIG. 28 is a block diagram of a server according to an exemplary embodiment of the inventive concept.

FIG. 28 is a block diagram of a server 10A according to an exemplary embodiment of the inventive concept.

Referring to FIG. 28, the server 10A includes first and second storage devices 100A and 200A, a processor 300A, and a memory 400A. The first and second storage devices 100A and 200A, the processor 300A, and the memory 400A may communicate with each other via a bus 600. The server 10A according to the present embodiment corresponds to a modification of the server 10 illustrated in FIG. 11, and redundant description will be omitted. For example, the first storage device 100A may include a transcoder TC, and the second storage device 200A may not include a transcoder.

The memory 400A stores an object mapping table OMT in which physical addresses, in which data has been stored for each object ID, are written. The processor 300A may search for a non-scalable format file, e.g., a non-SVC object, from among files stored in the second storage device 200A, based on the object mapping table OMT. The processor 300A may provide a non-SVC object and a transcoding command stored in the second storage device 200A to the first storage device 100A. In an embodiment, the first storage device 100A generates an SVC object by transcoding the non-SVC object from an original format to a scalable format in response to the transcoding command. In an embodiment, the first storage device 100A provides the SVC object to the second storage device 200A. However, the inventive concept is not limited thereto, and the first storage device 100A may store the SVC object.

Figure 29:
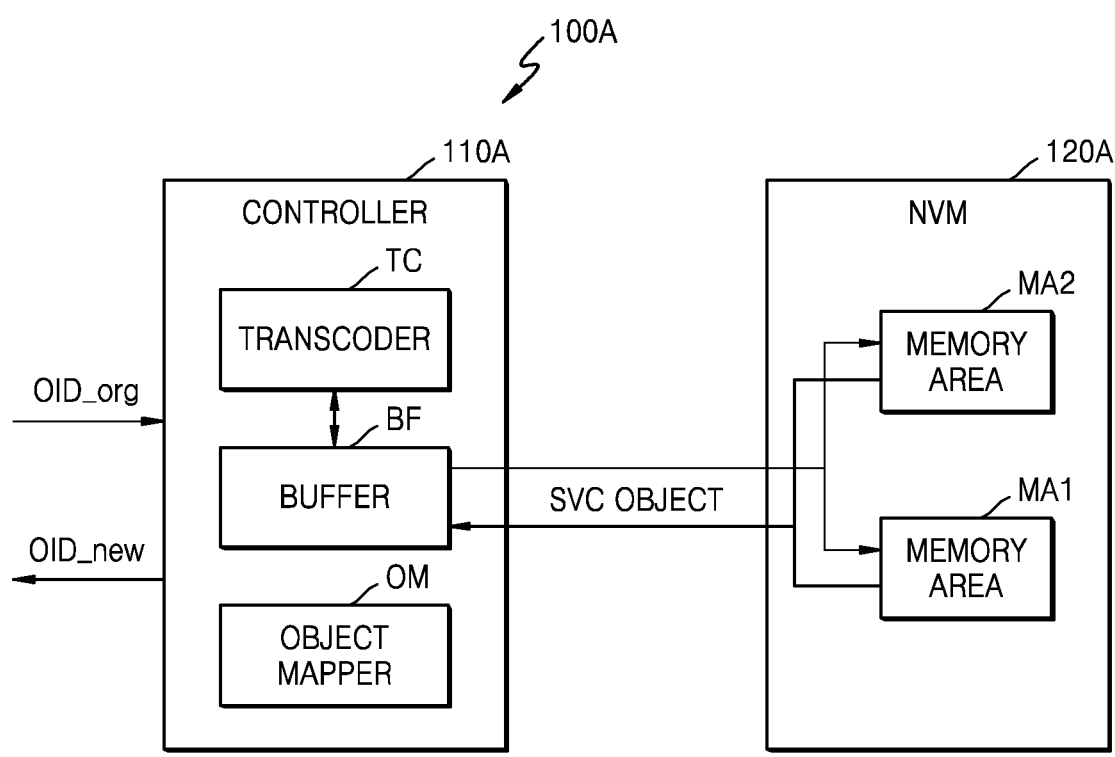
FIG. 29 is a block diagram of a storage device in FIG. 28, according to an exemplary embodiment of the inventive concept.

FIG. 29 is a block diagram of the first storage device 100A in FIG. 28, according to an exemplary embodiment of the inventive concept. Referring to FIGS. 28 and 29, the first storage device 100A receives an original object ID OID_org to be transcoded. The first storage device 100A transcodes a non-scalable format file corresponding to the original object ID OID_org into a scalable format file. The first storage device 100A outputs a transcoded new object ID OID_new.

In an embodiment, the first storage device 100A stores the scalable format file in the non-volatile memory 120A. However, the inventive concept is not limited thereto, and the first storage device 100A may output the scalable format file to the outside without storing the scalable format file in the non-volatile memory 120A. In this case, the processor 300A may operate to store the scalable format file in the second storage device 200A or another storage space.

Figure 30:
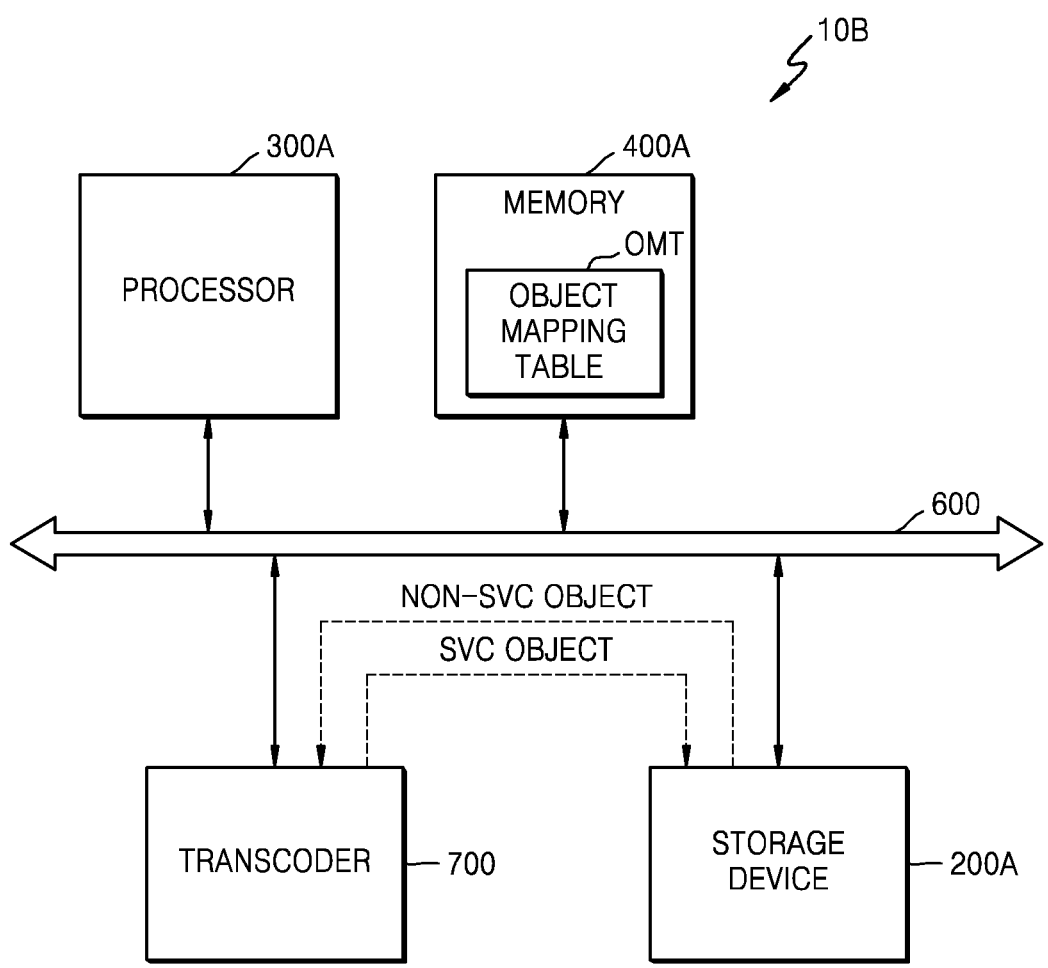
FIG. 30 is a block diagram of a server according to an exemplary embodiment of the inventive concept.

FIG. 30 is a block diagram of a server 10B according to an exemplary embodiment of the inventive concept.

Referring to FIG. 30, the server 10B includes a second storage device 200A, a processor 300A, a memory 400A, and a transcoder 700. The second storage device 200A, the processor 300A, the memory 400A, and the transcoder 700 may communicate with each other via a bus 600. The server 10B according to the present embodiment corresponds to a modification of the server 10 shown in FIG. 11 or the server 10A shown in FIG. 28, and redundant description will be omitted. For example, the second storage device 200A does not include a transcoder.

The memory 400A may store an object mapping table OMT in which physical addresses, in which data has been stored for each object ID, are written. The processor 300A may search for a non-scalable format file (e.g., a non-SVC object) from among files stored in the second storage device 200A, based on the object mapping table OMT. The processor 300A may provide the transcoder 700 with a non-SVC object and a transcoding command stored in the second storage device 200A. In an embodiment, the transcoder 700 generates an SVC object by transcoding the non-SVC object from an original format to a scalable format in response to the transcoding command. In an embodiment, the transcoder 700 provides the SVC object to the second storage device 200A. In some embodiments, the server 10B further includes another storage device. In this case, the SVC object generated by the transcoder 700 may be stored in the other storage device rather than the second storage device 200A.

Figure 31:
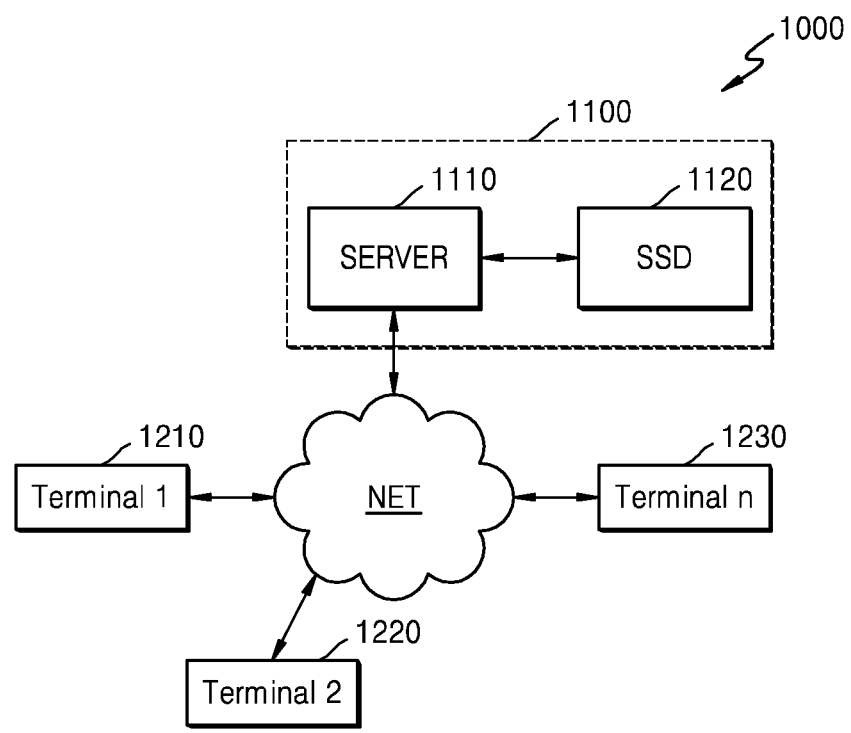
FIG. 31 illustrates a network system according to an exemplary embodiment of the inventive concept.

FIG. 31 illustrates a network system 1000 according to an exemplary embodiment of the inventive concept.

Referring to FIG. 31, the network system 1000 includes a server system 1100 and a plurality of terminals 1210 to 1230 communicating with the server system 1100 via a network NET. The server system 1100 includes a server 1110 and a solid state drive SSD 1120. In this case, the server 1110 may correspond to one of the servers 10, 10', 10A, and 10B in the embodiments described above, and the SSD 1120 may correspond to one of the storage devices 100, 100', 100A, and 100B in the embodiments described above. The SSD 1120 may be implemented by using the embodiments described with reference to FIGS. 1 to 30.

Figure 32:
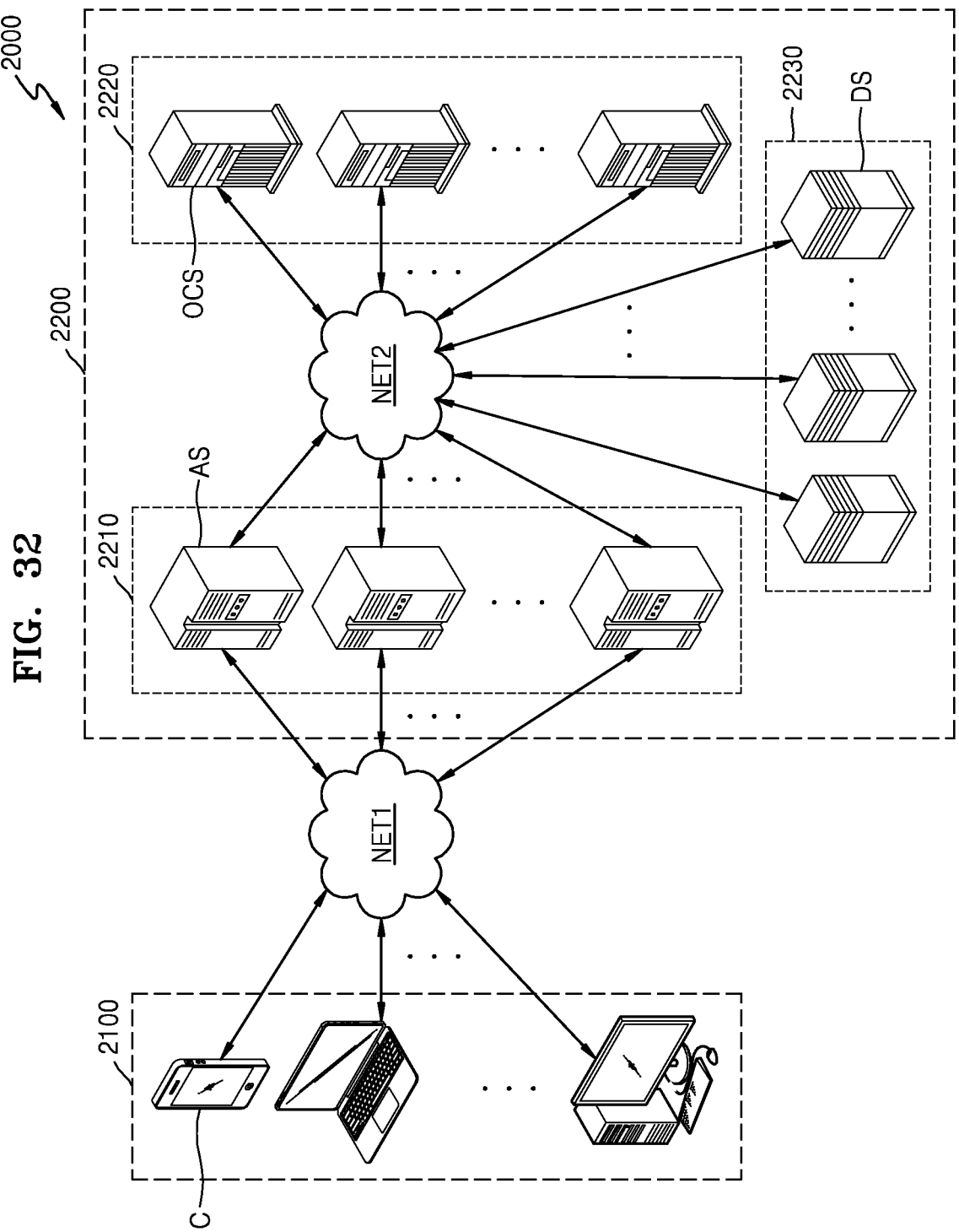
FIG. 32 illustrates a network system according to an exemplary embodiment of the inventive concept.

FIG. 32 illustrates a network system 2000 according to an exemplary embodiment of the inventive concept.

Referring to FIG. 32, the network system 2000 includes a client group 2100 and a data center 2200. The client group 2100 may include client devices C communicating with the data center 2200 via a first network NET1, for example, via the Internet. The data center 2200 is a facility storing various gathered data and providing services, and may include an application server group 2210, a database server group 2220, and an object cache server group 2230, which communicate with each other via a second network NET2, for example, a local area network (LAN) or an intranet.

The application server group 2210 may include application server devices AS, and the application server devices AS may process a request received from the client group 2100, and may access the database server group 2220 or the object cache server group 2230 according to the request of the client group 2100. The database server group 2220 may include database server devices DS storing data processed by the application server devices AS. The object cache server group 2230 may include object cache server devices OCS temporarily storing data which is stored in the database server devices DS or read from the database server devices DS, and thus, may perform a function of a cache between the application server devices AS and the database server devices DS. In an embodiment, the database server devices DS are implemented by using the embodiments described with reference to FIGS. 1 to 30.

While the inventive concept has been particularly shown and described with reference to embodiments thereof, it will be understood that various changes in form and details may be made therein without departing from the spirit and scope of the disclosure.

What is claimed is:

1. A storage device comprising:
a non-volatile memory including a first memory area and a second memory area; and
a memory controller configured to receive a first multimedia file and an upload request from a first client device to upload the first multimedia file, transcode the first multimedia file of an original format to a second multimedia file of a scalable format including a base layer and a plurality of enhancement layers in response to the upload request, and control the non-volatile memory to store the base layer in the first memory area having a first storage reliability level and store the plurality of enhancement layers in the second memory area having a second storage reliability level lower than the first storage reliability level,
wherein the memory controller is configured to receive a first retrieve request for a third multimedia file with a first resolution or a first bit rate, from the first client device or a second client device, read the second multimedia file from the non-volatile memory in response to receipt of the first retrieve request, and
wherein the memory controller is configured to determine an importance level of one of the enhancement layers upon detecting an error in data corresponding to the one enhancement layer, and retry reading of the one enhancement layer to transcode the second multimedia file to the third multimedia file when the importance level is determined to be greater than or equal to a reference level, and transcode the second multimedia file to the third multimedia file excluding the one enhancement layer when the importance level is determined to be less than the reference level, and the importance level is determined to be less than the reference level when the one enhancement layer is a high frame rate layer.

2. The storage device of claim 1, wherein the first memory area comprises single level cells (SLCs) and the second memory area comprises multi level cells (MLCs).

3. The storage device of claim 1, wherein the first storage reliability level is based on a program/erase cycle count of the first memory area that is less than a reference count, and the second storage reliability level is based on a program/erase cycle count of the second memory area that is greater than or equal to the reference count.

4. The storage device of claim 1, wherein the first storage reliability level is based on a number of error bits in the first memory area that is less than a reference number, and the second storage reliability level is based on a number of error bits in the second memory area that is greater than or equal to the reference number.

5. The storage device of claim 1, wherein the memory controller is further configured to transcode data corresponding to the base layer to generate the third multimedia file upon detecting the error in the data corresponding to one enhancement layer.

6. The storage device of claim 1, wherein the first client device or the second client device is capable of reproducing a file of the scalable format, wherein the memory controller is further configured to receive a second retrieve request for a multimedia file with a second resolution or a second bit rate, from the first or second client device, read data corresponding to the second retrieve request from the second multimedia file stored in the non-volatile memory, and provide the read data to the first or second client device.

7. The storage device of claim 6, wherein the read data is data corresponding to the base layer or data corresponding to both the base layer and the plurality of enhancement layers, according to the second resolution or the second bit rate.

8. The storage device of claim 7, wherein the plurality of enhancement layers comprises a first enhancement layer and a second enhancement layer, wherein the memory controller is further configured to provide, to the first or second client device, data corresponding to the base layer and the first enhancement layer upon detecting an error in data corresponding to the second enhancement layer.

9. The storage device of claim 7, wherein the plurality of enhancement layers comprises a first enhancement layer and a second enhancement layer, wherein the memory controller is further configured to provide, to the first or second client device, data corresponding to the base layer and the first enhancement layer and an error message upon detecting an error in data corresponding to the second enhancement layer.

10. The storage device of claim 1, wherein the memory controller comprises:
an object mapper configured to determine a physical address for storing the second multimedia file in the non-volatile memory; and
a mapping table configured to map the physical address to an object identifier associated with the second multimedia file.

11. The storage device of claim 10, wherein the object mapper determines the physical address based on at least one of an importance degree and a bit rate of data in the second multimedia file.

12. The storage device of claim 1, wherein the memory controller is further configured to transcode a fourth multimedia file having a non-scalable format stored in the non-volatile memory into a fifth multimedia file having the scalable format and control the non-volatile memory to store the fifth multimedia file in the non-volatile memory.

13. A storage server comprising the storage device of claim 1.

* * * * *